United States Patent
Yoshida et al.

(10) Patent No.: US 10,338,468 B2
(45) Date of Patent: Jul. 2, 2019

(54) PHOTOSENSITIVE RESIN COMPOSITION, PHOTOSENSITIVE RESIN LAMINATE, RESIN PATTERN PRODUCTION METHOD, CURED FILM, AND DISPLAY DEVICE

(71) Applicant: ASAHI KASEI KABUSHIKI KAISHA, Tokyo (JP)

(72) Inventors: Mayuki Yoshida, Tokyo (JP); Satoshi Shibui, Tokyo (JP)

(73) Assignee: ASAHI KASEI KABUSHIKI KAISHA, Tokyo (JP)

(*) Notice: Subject to any disclaimer, the term of this patent is extended or adjusted under 35 U.S.C. 154(b) by 253 days.

(21) Appl. No.: 15/510,619

(22) PCT Filed: Sep. 24, 2015

(86) PCT No.: PCT/JP2015/076940
§ 371 (c)(1),
(2) Date: Mar. 10, 2017

(87) PCT Pub. No.: WO2016/047691
PCT Pub. Date: Mar. 31, 2016

(65) Prior Publication Data
US 2017/0285474 A1 Oct. 5, 2017

(30) Foreign Application Priority Data
Sep. 24, 2014 (JP) .................. 2014-194059

(51) Int. Cl.
| | |
|---|---|
| G06F 3/041 | (2006.01) |
| G03F 7/033 | (2006.01) |
| G03F 7/027 | (2006.01) |
| G03F 7/031 | (2006.01) |
| G03F 7/038 | (2006.01) |
| G03F 7/09 | (2006.01) |
| G03F 7/20 | (2006.01) |
| G03F 7/32 | (2006.01) |

(52) U.S. Cl.
CPC .............. *G03F 7/033* (2013.01); *G03F 7/027* (2013.01); *G03F 7/031* (2013.01); *G03F 7/038* (2013.01); *G03F 7/09* (2013.01); *G03F 7/20* (2013.01); *G03F 7/322* (2013.01); *G06F 3/041* (2013.01); *B32B 2457/208* (2013.01)

(58) Field of Classification Search
CPC ... B32B 2457/208; G06F 3/041; G03F 7/027; G03F 7/028; G03F 7/031; G03F 7/038; G03F 7/033; G03F 7/09
USPC ............................... 430/281.1, 321
See application file for complete search history.

(56) References Cited

U.S. PATENT DOCUMENTS

| | | | |
|---|---|---|---|
| 2014/0363767 A1 | 12/2014 | Murakami et al. | |
| 2014/0377704 A1 | 12/2014 | Mukai et al. | |
| 2015/0299520 A1* | 10/2015 | Mansei | C09J 4/00 428/78 |
| 2017/0146905 A1* | 5/2017 | Aridomi | C09D 4/00 |

FOREIGN PATENT DOCUMENTS

| | | |
|---|---|---|
| EP | 2554366 A1 | 2/2013 |
| JP | 2003-21899 A | 1/2003 |
| JP | 2006-331478 A | 12/2006 |
| JP | 2011-224957 A | 11/2011 |
| JP | 2011-237668 A | 11/2011 |
| JP | 2013-76821 A | 4/2013 |
| JP | 2013-92693 A | 5/2013 |
| JP | 5304970 B1 | 10/2013 |
| JP | 5304973 B1 | 10/2013 |
| JP | 5707420 B2 | 4/2015 |
| KR | 10-2014-0101783 A | 8/2014 |
| TW | 200909451 A | 3/2009 |
| WO | WO 2008/125199 A1 | 10/2008 |
| WO | WO 2012/101908 A1 | 8/2012 |
| WO | WO 2014/024951 A1 | 2/2014 |

OTHER PUBLICATIONS

English translation of the International Preliminary Report on Patentability, dated Apr. 6, 2017, including the English translation of the Written Opinion dated Oct. 27, 2015 (Forms PCT/IB/338, PCT/IB/373 and PCT/ISA/237), issued in International Application No. PCT/JP2015/076940.
English translation of the International Search Report (Form PCT/ISA/210) issued in International Application No. PCT/JP2015/076940 dated Oct. 27, 2015.
English translation of the Written Opinion of the International Searching Authority (Form PCT/ISA/237) issued in International Application No. PCT/JP2015/076940 dated Oct. 27, 2015.

* cited by examiner

*Primary Examiner* — John A McPherson
(74) *Attorney, Agent, or Firm* — Birch, Stewart, Kolasch & Birch, LLP

(57) ABSTRACT

The present invention provides a photosensitive resin laminate in which (A) an alkali-soluble polymer, (B) a compound having an ethylenically unsaturated double bond, and (C) a photosensitive resin layer including a photopolymerization initiator are laminated on a support film. The photosensitive resin laminate is used in forming the protective film of a conductor part, the thickness of the photosensitive resin is 20 μm or less, and the cured product of the photosensitive resin layer satisfies conditions (1) to (3): (1) the crosslink density is 1,000 mol/m$^3$-8,000 mol/m$^3$; (2) the peak top value of Tan δ is 0.4 or greater; and (3) the refractive index at a wavelength of 532 nm is 1.50-1.60.

11 Claims, 1 Drawing Sheet

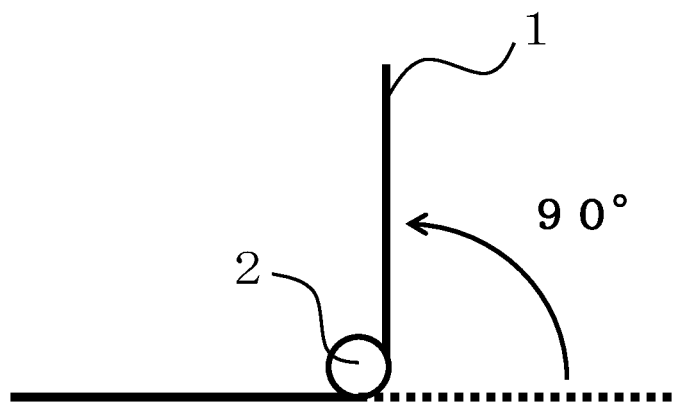

PHOTOSENSITIVE RESIN COMPOSITION, PHOTOSENSITIVE RESIN LAMINATE, RESIN PATTERN PRODUCTION METHOD, CURED FILM, AND DISPLAY DEVICE

TECHNICAL FIELD

The present invention relates to a photosensitive resin composition and a photosensitive resin laminate, and to a resin pattern production method, cured film and display device using the photosensitive resin laminate, and more specifically, it relates to a photosensitive resin composition and photosensitive resin laminate that are suitable for formation of flattening films, protective films and interlayer dielectric films for electronic components in such devices as liquid crystal display devices, organic EL display devices, touch panel display devices, integrated circuit elements, solid pickup elements and semiconductor elements, as well as to a resin pattern production method using the same.

BACKGROUND ART

With the increasingly high performance, diversification and size and weight reduction of electronic devices in recent years, there has been an increase in devices designed with transparent touch panels (touch sensors) mounted across the full screens of display devices such as liquid crystal displays. An increasing number of devices also have transparent touch panels that allow visibility and selectability of characters, symbols and images displayed on the display device, with switching of various functions of the device being performed by operation of the transparent touch panel. Touch panels are used not only in large-size electronic devices such as personal computers and television sets, but also in a wide variety of display devices including those of car navigation systems, cellular phones, miniature electronic devices such as electronic dictionaries, and OA•FA devices, wherein the touch panels are provided with electrodes made of transparent conductive electrode materials. Known transparent conductive electrode materials include ITO (Indium-Tin-Oxide), indium oxide and tin oxide, which are mainly used as electrode materials for liquid crystal display unit substrates because of their high visible light transmittance.

Existing touch panel systems that are currently being implemented include resistance film systems, optics systems, pressure systems, electrostatic capacitive systems, electromagnetic wave guide systems, image recognition systems, vibration detection systems and ultrasonic systems, the greatest increase in use, in recent years, being that of electrostatic capacitive touch panels. With an electrostatic capacitive touch panel, contacting the touch input screen with the fingertip (which is a conductor) creates electrostatic capacitive coupling between the fingertip and the conductive film, forming a condenser. The electrostatic capacitive touch panel notes changes in electrical charge at the location of contact with the fingertip, thereby detecting the coordinates. In particular, projection-type electrostatic capacitive touch panels have high operability as they allow detection of multiple points with the fingertip, permitting complex selection to be made, and for this reason they are being increasingly utilized as input devices for display surfaces on devices with small-size displays such as cellular phones and portable music players. In a projection-type electrostatic capacitive touch panel it is common to form a two-layer structure from a plurality of X electrodes and a plurality of Y electrodes perpendicular to the X electrodes, in order to present two-dimensional coordinates with an X-axis and a Y-axis, with ITO generally being used as the electrode material.

Incidentally, a touch panel has a frame region in which it is unable to detect touch locations, and therefore one important way of increasing product value is to narrow the area of the frame region. The frame region must have metal wiring for transmission of signals detected at the touch locations, and the width of the metal wiring must be narrowed in order to achieve a narrower frame area. Copper is most commonly used as the metal wiring.

Such touch panels, however, when contacted with fingertips, can become infiltrated with corrosive components such as moisture and salts inside their sensing regions. When corrosive components infiltrate the interior of a touch panel, the metal wiring becomes corroded and electrical resistance between the electrodes and driving circuit increases, or wire breakage may occur in some cases.

Moreover, the touch panel itself is subjected to physical load during the production steps for the touch panel. Particularly when a protective film is provided on a flexible display panel, the load on the protective film increases as the panel is curved, and this tends to result in cracking.

A demand therefore exists for a protective film that reduces corrosion of metal wiring, that has high adhesiveness with flexible display panels, and that is flexible sufficient to withstand curving of panels.

Patent Literatures (PTLs) 1 and 2 propose means for meeting this demand. In PTL 1, the protective film is used for the purpose of minimizing corrosion of the copper wiring used for transmission of touch location detection signals, but the purpose of flex resistance is not mentioned. PTL 2 describes how toughness can be imparted to a material by combination with a specific crosslinking agent, but mentions only the elastic modulus, with no mention regarding any connection with crack resistance.

Protective films designed to protect circuit board surfaces or pattern circuits on flexible display panels include not only the protective films mentioned above but also various types of photosensitive material films such as photosensitive cover lay films and photosensitive dry film resists, etc., which are used depending on the intended purpose.

Most photosensitive cover lay films and photosensitive dry film resists are polyimide-based, acrylic or epoxy-based films, since properties such as heat resistance, chemical resistance and flex resistance are required for the cured films.

Epoxy-based films have long been employed, but while they exhibit excellent heat resistance and chemical resistance, they also lack flex resistance.

As an example of an acrylic film, PTL 3 proposes a dry film resist to be used for fabrication of a printed circuit board. In PTL 3, excellent flexibility is obtained for the cured resist, but nothing is mentioned in regard to the performance required as a permanent material for protecting electrodes or metal wiring (for example, minimizing corrosion of the copper wiring, or regarding the thermomechanical strength of the material).

A polyimide-based film is proposed in PTL 4, for example. In PTL 4, the heat resistance, chemical resistance and flex resistance of the cured film is excellent, but there may be concerns generation of gas regarding imidation reaction during thermosetting or during deblocking of blocked isocyanates.

CITATION LIST

Patent Literature

[PTL 1] Japanese Patent Publication No. 5304973
[PTL 2] Japanese Patent Publication No. 5304970
[PTL 3] Japanese Patent Publication No. 5707420
[PTL 4] International Patent Publication No. WO2014/024951

DISCLOSURE OF THE INVENTION

Problems to be Solved by the Invention

The technologies disclosed in PTLs 1 to 4 are in need of improvement, as mentioned above. It is therefore an object of the present invention to provide a photosensitive resin composition and photosensitive resin laminate having low outgas during thermosetting, excellent balance between rust resistance, flexibility and hardness, and suitability for protection of conductor parts such as wirings and electrodes.

Means for Solving the Problems

As a result of much research conducted by the present inventors with the aim of solving the problems described above, the present invention has been completed upon finding that if a photosensitive resin laminate formed from a photosensitive resin composition including an alkali-soluble polymer (A), a compound having an ethylenic unsaturated double bond (B) and a photopolymerization initiator (C) has a cured crosslink density of 1,000 to 8,000 mol/m³, a Tan δ peak top value of 0.4 or greater, and a refractive index in the range of 1.50 to 1.60 at a wavelength of 532 nm, the resulting film has excellent balance between rust resistance, flexibility and hardness.

Specifically, the present invention provides the following.

[1]
A photosensitive resin laminate comprising a support film, and a photosensitive resin layer including:
(A) an alkali-soluble polymer;
(B) a compound having an ethylenic unsaturated double bond; and
(C) a photopolymerization initiator;
wherein the photosensitive resin layer is laminated on the support film,
the photosensitive resin laminate is to be used to form a protective film for a conductor component,
the thickness of the photosensitive resin layer is less than or equal to 20 μm, and
a cured product of the photosensitive resin layer satisfies the following conditions (1) to (3):
(1) a crosslink density of 1,000 mol/m³ to 8,000 mol/m³;
(2) a Tan δ peak top value of 0.4 or greater; and
(3) a refractive index of 1.50 to 1.60 at a wavelength of 532 nm.

[2]
The photosensitive resin laminate according to [1], wherein the alkali-soluble polymer (A) includes an optionally substituted phenyl group.

[3]
The photosensitive resin laminate according to [1] or [2], wherein the glass transition temperature of the photosensitive resin layer after exposure is lower than 100° C.

[4]
The photosensitive resin laminate according to any one of [1] to [3], wherein the compound having an ethylenic unsaturated double bond (B) includes a compound having at least three ethylenic unsaturated double bonds, and a compound including in the molecule a group represented by the following formula (1):

[Chemical Formula 1]

{wherein A is an alkylene group with 4 or more carbon atoms, and m is an integer of 1 to 30}.

[5]
The photosensitive resin laminate according to any one of [1] to [4], wherein the conductor component is a copper electrode or a transparent electrode.

[6]
The photosensitive resin laminate according to any one of [1] to [5], wherein the photosensitive resin laminate is to be used as a protective film for a touch panel or a protective film for a touch sensor.

[7]
The photosensitive resin laminate according to any one of [1] to [6], wherein the photosensitive resin layer further includes a thermal crosslinking agent (D).

[8]
A photosensitive resin composition for a wiring protective film, including 30 mass % to 70 mass % of an alkali-soluble polymer (A), 20 mass % to 60 mass % of a compound having an ethylenic unsaturated double bond (B) and 0.1 mass % to 10 mass % of a photopolymerization initiator (C), wherein
the alkali-soluble polymer (A) includes an optionally substituted phenyl group, and
the compound having an ethylenic unsaturated double bond (B) includes a compound including in the molecule a group represented by the following formula (1):

[Chemical Formula 2]

{wherein A is an alkylene group with 4 or more carbon atoms, and m is an integer of 1 to 30}, and a compound including in the molecule a group represented by the following formula (2):

[Chemical Formula 3]

[9]
The photosensitive resin composition for a wiring protective film according to [8], wherein the compound having an ethylenic unsaturated double bond (B) includes trimethylolpropane tri(meth)acrylate and polytetramethyleneglycol di(meth)acrylate.

[10]
The photosensitive resin composition according to [8] or [9], wherein the photosensitive resin composition for a wiring protective film further includes a thermal crosslinking agent (D).
[11]
A photosensitive resin laminate comprising a support film, and a photosensitive resin layer made of the photosensitive resin composition for a wiring protective film according to any one of [8] to [10], formed on the support film.
[12]
A pattern production method including a step of laminating the photosensitive resin laminate according to any one of [1] to [7] and [11] on a substrate, and exposing and developing the laminate to form a pattern.
[13]
A cured film pattern obtained by subjecting a pattern formed by the method according to [12], to post-exposure treatment and/or heat treatment.
[14]
A touch panel display having the cured film pattern according to [13].
[15]
A device having the cured film pattern according to [13] and a touch sensor.

Effect of the Invention

According to the invention, there is provided a photosensitive resin composition and a photosensitive resin laminate having excellent balance between rust resistance, flexibility and hardness, and suitability for protection of wirings.

BRIEF DESCRIPTION OF THE DRAWINGS

FIG. 1 is a diagram illustrating the method of the flex resistance test used for the examples.

BEST MODE FOR CARRYING OUT THE INVENTION

The best mode for carrying out the invention (hereunder referred to as "embodiment") will now be described in detail. The present invention is not limited to the embodiment described below, and various modifications may be implemented within the scope of the gist thereof.
[Photosensitive Resin Composition and Photosensitive Resin Laminate]
For this embodiment, the photosensitive resin laminate is formed from a photosensitive resin composition that includes an alkali-soluble polymer (A), a compound having an ethylenic unsaturated double bond (B) and a photopolymerization initiator (C). The photosensitive resin composition may further optionally include a thermal crosslinking agent (D) and/or another compound. The photosensitive resin composition is preferably used for formation of a conductor component protective film, and more preferably it is used for formation of a wiring protective film or touch panel electrode protective film. Each of the components in the photosensitive resin composition will now be explained in detail.
<(A) Alkali-Soluble Polymer>
The alkali-soluble polymer (A) is a polymer containing a carboxyl group, examples of which include copolymers of (meth)acrylic acid, (meth)acrylic acid esters, (meta)acrylonitrile and (meth)acrylamide, and novolac resin-modified polymers.

A copolymer as a binder polymer may also contain as structural units, in addition to the structural units already mentioned above, other monomers that are copolymerizable with those structural units. Examples of other monomers include hydroxyalkyl (meth)acrylate, maleic anhydride derivatives, tetrahydrofurfuryl (meth)acrylate ester, dimethylaminoethyl (meth)acrylate ester, diethylaminoethyl (meth)acrylate ester, glycidyl (meth)acrylate ester, benzyl (meth)acrylate ester, 2,2,2-trifluoroethyl (meth)acrylate, 2,2,3,3-tetrafluoropropyl (meth)acrylate, (meth)acrylamide, (meta)acrylonitrile, diacetone (meth)acrylamide, styrene, vinyltoluene and PR-300G (trade name of Showa HighPolymer Co., Ltd.).

More preferred among these copolymers, from the viewpoint of rust resistance of wiring and electrodes formed on the substrate, are copolymers containing a structural unit derived from (meth)acrylic acid and a structural unit derived from an aromatic ester of (meth)acrylic acid or styrene.

By copolymerizing a unit with an aromatic group, the hydrophobicity of the alkali-soluble polymer will be increased and the rust resistance will be higher. The aromatic group may be optionally substituted phenyl, for example. Also, if the alkali-soluble polymer has an aromatic group, the film density of the cured photosensitive resin laminate may be increased, and the rust resistance may be improved. The film density of the photosensitive resin layer is in a strict correlation with the refractive index, the film density tending to be higher with a higher refractive index. While a higher refractive index may be considered preferable from the viewpoint of rust resistance, the developability will be impaired if it is too high.

The acid equivalent (g/mol) of the alkali-soluble polymer is preferably 430 to 860. The acid equivalent is preferably 430 or greater from the viewpoint of improving rust resistance, and preferably no greater than 860 from the viewpoint of improving developability. From the viewpoint of balance between rust resistance and developability, the acid equivalent is more preferably 430 to 570 and even more preferably 430 to 510.

The acid equivalent can be measured using a COM-555 Hiranuma Automatic Titrator by Hiranuma Sangyo Corp., based on potential difference titration, using 0.1 mol/L sodium hydroxide. When the composition includes different alkali-soluble polymers (A), the acid equivalent referred to is the overall value for the alkali-soluble polymers.

The weight-average molecular weight of the alkali-soluble polymer is not particularly restricted, but is usually preferred to be between 5,000 and 500,000, inclusive, from the viewpoint of coatability, coated film strength and developability. The weight-average molecular weight of the alkali-soluble polymer is preferably 5,000 or greater from the viewpoint of the properties of the developing aggregates, and the unexposed film properties including the edge fusing property and cut chipping property of the photosensitive resin laminate, while it is also preferably no greater than 500,000 from the viewpoint of improving the developability. The edge fusing property is the phenomenon in which, when the photosensitive resin laminate has been rolled up, the photosensitive resin composition layer seeps from the edges of the roll. The cut chipping property is the phenomenon in which chips fly off from the unexposed film when it has been cut with a cutter. When chips that have flown off adhere to the top side of the photosensitive resin laminate, they are transferred to the mask in the subsequent exposure step, resulting in a defective product. The weight-average molecular weight of the alkali-soluble polymer is more preferably 5,000 to 300,000, and even more preferably 10,000 to 200,000. The weight-average molecular weight is measured using a Gel Permeation Chromatograph (GPC) by JASCO Corp., with the conditions set as specified below. The obtained weight-average molecular weight is based on polystyrene.
Pump: Model PU-1580 by Gulliver
Column: Four columns in series, Shodex® KF-807, KF-806 M, KF-806 M and KF-802.5 by Showa Denko K.K.
Moving bed solvent: tetrahydrofuran
Calibration curve: Plotted in reference to polystyrene standard sample {using calibration curve for polystyrene standard sample (Shodex STANDARD SM-105 by Showa Denko K.K.)}

The alkali-soluble polymer content in the photosensitive resin composition is 30 mass % to 70 mass %, based on the mass of the photosensitive resin composition, and from the viewpoint of rust resistance of the wiring or electrodes formed on the substrate, it is preferably 40 to 65 mass % and more preferably 50 mass % to 60 mass %.

<(B) Compound with Ethylenic Unsaturated Double Bond>

The compound having an ethylenic unsaturated double bond (B) may be a compound obtained by reacting an α,β-unsaturated carboxylic acid (for example, acrylic acid or methacrylic acid) with a polyhydric alcohol such as polyethyleneglycol di(meth)acrylate, polypropyleneglycol di(meth)acrylate, polytetramethyleneglycol di(meth)acrylate, polyalkylene glycol-modified trimethylolpropane di(meth)acrylate, bisphenol A-modified polyalkyleneoxy di(meth)acrylate, bisphenol A diglycidyl ether di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, or a compound obtained by addition of an α,β-unsaturated carboxylic acid to a glycidyl group-containing compound such as trimethylolpropane-triglycidyl ether tri(meth)acrylate.

From the viewpoint of adequate rust resistance to protect the substrate, electrodes and other components, the compound having an ethylenic unsaturated double bond (B) preferably uses a compound having at least three ethylenic unsaturated double bonds, and as specific examples it preferably includes one or more selected from among (meth)acrylate compounds with a pentaerythritol backbone, (meth)acrylate compounds with a trimethylolpropane backbone, and (meth)acrylate compounds with a glycerin backbone, and more preferably includes one or more selected from among (meth)acrylate compounds with a pentaerythritol backbone and (meth)acrylate compounds with a trimethylolpropane backbone.

The term "(meth)acrylate with a pentaerythritol backbone" means an ester compound of pentaerythritol or dipentaerythritol and (meth)acrylic acid, and it also includes such ester compounds modified with alkyleneoxy groups. The ester compound may also contain in admixture a compound with 1 to 6 ester bonds per molecule (a maximum of 4 ester bonds for pentaerythritol, or a maximum of 6 ester bonds for dipentaerythritol).

The term "(meth)acrylate compound with a trimethylolpropane backbone" means an ester compound of trimethylolpropane or ditrimethylolpropane and (meth)acrylic acid, and it also includes such ester compounds modified with alkyleneoxy groups. The ester compound may also contain in admixture a compound with 1 to 4 ester bonds per molecule (a maximum of 3 ester bonds for trimethylolpropane, or a maximum of 4 ester bonds for ditrimethylolpropane).

The term "(meth)acrylate compound with a glycerin backbone" means an ester compound of glycerin or diglycerin and (meth)acrylic acid, and it also includes such ester compounds modified with alkyleneoxy groups. The ester compound may also contain in admixture a compound with 1 to 4 ester bonds per molecule (a maximum of 3 ester bonds for glycerin, or a maximum of 4 ester bonds for diglycerin).

More preferred among the compounds having at least three ethylenic unsaturated double bonds mentioned above, are (meth)acrylate compounds with a trimethylolpropane backbone, from the viewpoint of adequate rust resistance to protect the substrate and electrodes.

Also preferred, from the viewpoint of flexibility, are one or more compounds selected from among (meth)acrylate compounds with a pentaerythritol backbone, modified with alkylene oxide as flexible chains, (meth)acrylate compounds with a trimethylolpropane backbone, and (meth)acrylate compounds with a glycerin backbone, polyethyleneglycol di(meth)acrylate and polytetramethyleneglycol di(meth)acrylate, among which one or more compounds selected from among alkylene oxide-modified (meth)acrylate compounds with a pentaerythritol backbone, (meth)acrylate compounds with a trimethylolpropane backbone and polytetramethyleneglycol di(meth)acrylate are more preferred.

The compound having an ethylenic unsaturated double bond may be used alone, but from the viewpoint of both rust resistance and flexibility, preferably two or more different compounds are used in combination.

From the viewpoint of both rust resistance and flexibility, the compound having an ethylenic unsaturated double bond more preferably includes compound (B-1) including in the molecule a group represented by the following formula (1):

[Chemical Formula 4]

(1)

{wherein A is an alkylene group with 4 or more carbon atoms, and m is an integer of 1 to 30}.

In compound (B-1) which includes in the molecule a group represented by formula (1), A is a divalent alkylene group with 4 or more carbon atoms, from the viewpoint of both rust resistance and flexibility. Preferred examples of compound (B-1) include 1,5-pentanediol di(meth)acrylate, 1,6-hexanediol di(meth)acrylate, 1,7-heptanediol di(meth)acrylate, 1,8-octanediol di(meth)acrylate, 1,9-nonanediol di(meth)acrylate, 1,10-decanediol di(meth)acrylate, 1,12-dodecanediol di(meth)acrylate, 1,6-hexanediol acrylic acid multimer ester (product name: VISCOAT #230D by Osaka Organic Chemical Industry, Ltd.), and polytetramethyleneglycol di(meth)acrylate.

Additional preferred examples for compound (B-1) include poly(meth)acrylates of one or more compounds selected from the group consisting of bisphenol A, pentaerythritol, glycerin, dipentaerythritol, diglycerin and isocyanurate that have been modified with polytetramethylene oxide; and reactive urethane oligomer compounds obtained by reacting a polyurethane prepolymer comprising a polytetramethylene glycol polyol and a diisocyanate compound, with hydroxyethyl (meth)acrylate or hydroxypropyl (meth)acrylate.

If flexibility is of primary importance, preferably A in formula (1) is a linear divalent alkylene group with 4 or more carbon atoms, and more preferably the number of repeating units m is an integer of 2 to 30.

From the viewpoint of obtaining a satisfactory balance between hardness, rust resistance and flexibility, the compound having an ethylenic unsaturated double bond more preferably includes compound (B-2) including in the molecule a group represented by the following structural formula (2).

[Chemical Formula 5]

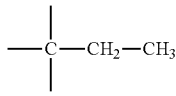

(2)

In formula (2), the carbon atom at the left may be a primary to quaternary carbon atom, and is preferably a quaternary carbon atom. Compound (B-2) including a group represented by formula (2) is preferably a compound with a trimethylolpropane backbone. Preferred examples include trimethylolpropane trimethacrylate, trimethylolpropane triacrylate, trimethacrylates or triacrylates of trimethylolpropane modified with alkylene oxides, ditrimethylolpropane tetramethacrylate, ditrimethylolpropane tetraacrylate, and tetramethacrylates or tetraacrylates of ditrimethylolpropane modified with alkylene oxides. Trimethylolpropane trimethacrylate or ditrimethylolpropane tetramethacrylate is preferred from the viewpoint of rust resistance.

For this embodiment of the invention, a compound including both a group represented by formula (1) and a group represented by formula (2) in the molecule has the function of both compound (B-1) and compound (B-2). For this embodiment, therefore, when such a compound is used alone, it is to be understood as constituting both compound (B-1) and compound (B-2).

Examples of compounds having a group represented by formula (1) and a group represented by formula (2) in the molecule include poly(meth)acrylates of trimethylolpropane or ditrimethylolpropane modified with polytetramethylene oxide.

From the viewpoint of resolution, adhesiveness and rust resistance, the content of the compound having an ethylenic unsaturated double bond in the photosensitive resin composition is preferably 20 mass % to 60 mass % and more preferably 30 mass % to 50 mass % based on the mass of the photosensitive resin composition.

Furthermore, from the viewpoint of both rust resistance and flexibility, the content of compound (B-1) in the photosensitive resin composition is preferably 10 mass % to 60 mass % with respect to 100 mass % of the alkaline polymer (A). From the viewpoint of flexibility, the content of compound (B-1) is preferably 10 mass % or greater, and from the viewpoint of rust resistance and pencil hardness, it is preferably no greater than 60 mass %, and more preferably 20 mass % to 50 mass %.

The content of compound (B-2) in the photosensitive resin composition is preferably 10 mass-% to 60 mass % with respect to 100 parts by mass of the alkaline polymer (A). From the viewpoint of rust resistance, the content of compound (B-2) is preferably 10 mass % or greater, and from the viewpoint of flexibility, it is preferably no greater than 60 mass %, and more preferably 20 mass % to 50 mass %.

<Photopolymerization Initiator (C)>

Examples for the photopolymerization initiator (C) include aromatic ketones such as benzophenone, N,N,N',N'-tetramethyl-4,4'-diaminobenzophenone (Michler's ketone), N,N,N',N'-tetraethyl-4,4'-diaminobenzophenone, 4-methoxy-4'-dimethylaminobenzophenone, 2-benzyl-2-dimethylamino-1-(4-morpholinophenyl)-butanone-1,2-methyl-1-[4-(methylthio)phenyl]-2-morpholino-propanone-1, acrylated benzophenones and 4-benzoyl-4'-methyldiphenyl sulfide; benzoinether compounds such as benzoinmethyl ether, benzoinethyl ether and benzoinphenyl ether; benzoin compounds such as benzoin, methylbenzoin and ethylbenzoin; oxime ester compounds such as 1,2-octanedione, 1-[4-(phenylthio)-,2-(O-benzoyloxime)], ethanone, 1-[9-ethyl-6-(2-methylbenzoyl)-9H-carbazol-3-yl]-,1-(O-acetyloxime) (Irgacure Oxe02 by BASF Japan), 1-[4-(phenylthio)phenyl]-3-cyclopentylpropane-1,2-dione-2-(o-benzoyloxime) (PBG305 by Changzhou Tronly New Electronic Materials Co., Ltd.), and 1,2-propanedione, 3-cyclohexyl-1-[9-ethyl-6-(2-furanylcarbonyl)-9H-carbazol-3-yl]-,2-(O-acetyloxime) (TR-PBG-326, product name of Nikko Chem Tech Corp.); benzyl derivatives such as benzyldimethylketal; acridine derivatives such as 9-phenylacridine and 1,7-bis(9,9'-acridinyl)heptane; N-phenylglycine derivatives such as N-phenylglycine; coumarin compounds; oxazole compounds; and phosphine oxide compounds such as 2,4,6-trimethylbenzoyl-diphenyl-phosphine oxide. These photopolymerization initiators may be used alone or in mixtures of two or more.

Preferred among these are oxime ester compounds and/or phosphine oxide compounds, in consideration of transparency of the protective film that is to be formed, and pattern formability with film thicknesses of 10 μm or smaller.

Specific oxime ester compounds include ethanone, 1-[9-ethyl-6-(2-methylbenzoyl)-9H-carbazol-3-yl]-,1-(O-acetyloxime) (Irgacure Oxe02, product of BASF Japan), 1-[4-(phenylthio)phenyl]-3-cyclopentylpropane-1,2-dione-2-(o-benzoyloxime) (TR-PBG-305, product name of Nikko Chem Tech Corp.), and 1,2-propanedione, 3-cyclohexyl-1-[9-ethyl-6-(2-furanylcarbonyl)-9H-carbazol-3-yl]-,2-(O-acetyloxime) (TR-PBG-326, product name of Nikko Chem Tech Corp.). Preferred from the viewpoint of storage stability are 1-[4-(phenylthio)phenyl]-3-cyclopentylpropane-1,2-dione-2-(o-benzoyloxime) (TR-PBG-305, product name of Nikko Chem Tech Corp.) and 1,2-propanedione, 3-cyclohexyl-1-[9-ethyl-6-(2-furanylcarbonyl)-9H-carbazol-3-yl]-, 2-(O-acetyloxime) (TR-PBG-326, product name of Nikko Chem Tech Corp.).

A preferred phosphine oxide compound is 2,4,6-trimethylbenzoyl-diphenyl-phosphine oxide, from the viewpoint of transparency of the protective film that is to be formed, and pattern formability with film thicknesses of 10 μm or smaller. The compound 2,4,6-trimethylbenzoyl-diphenyl-phosphine oxide is commercially available, for example, as LUCIRIN TPO (trade name of BASF).

The content of the photopolymerization initiator (C) in the photosensitive resin composition is 0.1 mass % to 10 mass % with respect to 100 mass % as the total solid content of the photosensitive resin composition, and from the viewpoint of transparency and image formability, it is more preferably 0.5 mass % to 5 mass %. Limiting the photopolymerization initiator content to the range of 0.1 mass % to 10 mass % can reduce problems such as inadequate photosensitivity, increased absorption on the surface of the composition during irradiation with active light rays, which results in inadequate photocuring of the interior, and reduced visible light transmittance.

<Thermal Crosslinking Agent (D)>

The photosensitive resin composition preferably further contains a thermal crosslinking agent (D) from the viewpoint of exhibiting higher rust resistance. A thermal crosslinking agent (D) is a compound that initiates addition reaction or condensation reaction with the alkali-soluble polymer (A) or with the unreacted compound having an ethylenic unsaturated double bond (B), with heating. The temperature at which addition reaction or condensation reaction is initiated is preferably 100° C. to 150° C. The addition reaction or condensation reaction takes place during heat treatment after a pattern has been formed by development.

As specific thermal crosslinking agents there may be mentioned maleimide compounds, epoxy compounds, oxetane compounds, melamine compounds, and compounds having the structure represented by the following formula (3):

[Chemical Formula 6]

{wherein X is an optionally substituted aromatic group or a nitrogen atom, $R_1$ is hydrogen or an alkyl group of 1 to 4 carbon atoms, and n is an integer of 1 or 2}, there being no limitation to these examples, however.

Maleimide compounds that may be used include maleimide and maleimide derivatives, with specific examples including monofunctional maleimides such as maleimide, N-methylmaleimide, N-ethylmaleimide, N-n-propylmaleimide, N-isopropylmaleimide, N-n-butylmaleimide, N-t-butylmaleimide, N-n-hexylmaleimide, N-dodecylmaleimide, N-cyclopentylmaleimide, N-cyclohexylmaleimide, N-(2,4-dimethylcyclohexyl)maleimide, N-vinylmaleimide, N-(meth)acrylic maleimide, N-methoxymethylmaleimide, N-(2-ethoxyethyl)maleimide, N-(4-butoxyethyl)maleimide, N-[(meth)acryloxymethyl]maleimide, N-[2-(meth)acryloxyethyl]maleimide, N-[3-(meth)acryloxypropyl]maleimide, N-methoxycarbonylmaleimide, N-(3-methoxycarbonylpropyl)maleimide, N-(2-hydroxyethyl)maleimide, N-(4-hydroxy-n-butyl)maleimide, N-(2-carboxyethyl)maleimide, N-(3-carboxypropyl)maleimide, N-(5-carboxypentyl)maleimide, N-phenylmaleimide, N-(4-methylphenyl)maleimide, N-(3-methylphenyl)maleimide, N-(2-methylphenyl)maleimide, N-(2,6-dimethylphenyl)maleimide, N-(2,6-diethylphenyl)maleimide, N-(4-styryl)maleimide, N-(4-methoxyphenyl)maleimide, N-(3-methoxyphenyl)maleimide, N-(2-methoxyphenyl)maleimide, N-(4-methoxycarbonylphenyl)maleimide, N-(4-hydroxyphenyl)maleimide, N-(3-hydroxyphenyl)maleimide, N-(2-hydroxyphenyl)maleimide, N-(4-carboxyphenyl)maleimide, N-(4-aminophenyl)maleimide, N-(4-nitrophenyl)maleimide, N-(1-naphthyl)maleimide, N-benzylmaleimide, N-(2-phenylethyl)maleimide, N-(9-acridinyl)maleimide, N-[4-(2-benzimidazolyl)phenyl]maleimide, N-succinimidyl 3-maleimidepropionate, N-succinimidyl 4-maleimidebutanoate, N-succinimidyl 11-maleimidelaurylate, N-succinimidyl 6-maleimidehexanoate, N-succinimidyl 4-(N-maleimidemethyl)cyclohexanecarboxylate, N-succinimidyl 4-(4-maleimidephenyl)butanoate and N-succinimidyl 3-maleimidebenzoate, and bismaleimides represented by the following formulas (4) to (6).

[Chemical Formula 7]

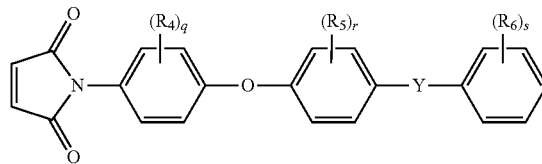

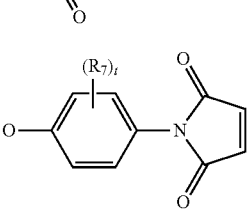

{In the formulas, Y represents an optionally branched alkylene chain of 1 to 10 carbon atoms or an arylene chain of 6 to 15 carbon atoms, $R_2$-$R_7$ each independently represent hydrogen, an alkyl group of C1 to 10 carbon atoms, an alkoxy group of 1 to 6 carbon atoms, or a hydroxy group, and o, p, q, r, s and t each independently represent an integer of 1 to 4.}

In formulas (4) to (6), Y is preferably an optionally branched alkylene chain of 1 to 6 carbon atoms or an arylene chain of 6 to 10 carbon atoms, and $R_2$-$R_7$ are each independently hydrogen, an alkyl group of 1 to 6 carbon atoms, an alkoxy group of 1 to 4 carbon atoms, or a hydroxy group. The aforementioned alkylene chains, arylene chains, alkyl groups and alkoxy groups may be either unsubstituted or substituted.

Specific examples of bismaleimides represented by formulas (4) to (6) include 1,2-bis(maleimide)ethane, 1,3-bis(maleimide)propane, 1,4-bis(maleimide)butane, 1,5-bis(maleimide)pentane, 1,6-bis(maleimide)hexane, 2,2,4-trimethyl-1,6-bis(maleimide)hexane, N,N'-1,3-phenylenebis(maleimide), 4-methyl-N,N'-1,3-phenylenebis(maleimide), N,N'-1,4-phenylenebis(maleimide), 3-methyl-N,N'-1,4-phenylenebis(maleimide), 4,4'-bis(maleimide)diphenylmethane, 3,3'-diethyl-5,5'-dimethyl-4,4'-bis(maleimide)diphenylmethane and 2,2-bis[4-(4-maleimidephenoxy)phenyl]propane.

From the viewpoint of resistance of the cured film to moist heat, and adhesiveness with substrates, the maleimide compound is preferably a bismaleimide compound represented by any of formulas (4) to (6).

From the viewpoint of transmittance in the visible light range (400 nm to 700 nm), when the film is to be used as a protective film for a touch panel or the like, it is preferred to use 3,3'-diethyl-5,5'-dimethyl-4,4'-bis(maleimide)diphenylmethane or 2,2-bis[4-(4-maleimidephenoxy)phenyl]propane, with 3,3'-diethyl-5,5'-dimethyl-4,4'-bis(maleimide)diphenylmethane being especially preferred.

Examples of epoxy compounds include alkylene oxide compounds, bisphenol A group-containing epoxy compounds and hydrogenated bisphenol A group-containing compounds. Preferred examples of alkylene oxide compounds include ethyleneglycol diglycidyl ether (for example, EPOLITE 40E by Kyoeisha Chemical Co., Ltd.), diethyleneglycol diglycidyl ether (for example, EPOLITE 100E by Kyoeisha Chemical Co., Ltd.), triethyleneglycol diglycidyl ether, tetraethyleneglycol diglycidyl ether (for example, EPOLITE 200E by Kyoeisha Chemical Co., Ltd.), pentaethyleneglycol diglycidyl ether, hexaethyleneglycol diglycidyl ether, heptaethyleneglycol diglycidyl ether, octaethyleneglycol diglycidyl ether, nonaethyleneglycol diglycidyl ether (for example, EPOLITE 400E by Kyoeisha Chemical Co., Ltd.), decaethyleneglycol diglycidyl ether, propyleneglycol diglycidyl ether (for example, EPOLITE 70P by Kyoeisha Chemical Co., Ltd.), dipropyleneglycol diglycidyl ether, tripropyleneglycol diglycidyl ether (for example, EPOLITE 200P by Kyoeisha Chemical Co., Ltd.), tetrapropyleneglycol diglycidyl ether, pentapropyleneglycol diglycidyl ether, hexapropyleneglycol diglycidyl ether, heptapropyleneglycol diglycidyl ether (for example, EPOLITE 400P by Kyoeisha Chemical Co., Ltd.), octapropyleneglycol diglycidyl ether, nonapropyleneglycol diglycidyl ether, decapropyleneglycol diglycidyl ether, tetramethyleneglycol diglycidyl ether, ditetramethyleneglycol diglycidyl ether, tritetramethyleneglycol diglycidyl ether, tetratetramethyleneglycol diglycidyl ether, pentatetramethyleneglycol diglycidyl ether, hexatetramethyleneglycol diglycidyl ether, heptatetramethyleneglycol diglycidyl ether, octatetramethyleneglycol diglycidyl ether, nonatetramethyleneglycol diglycidyl ether, neopentyl glycol diglycidyl ether (for example, EPOLITE 1500NP by Kyoeisha Chemical Co., Ltd.), 1,6-hexanediol diglycidyl ether (for example, EPOLITE 1600 by Kyoeisha Chemical Co., Ltd.), hydrogenated bisphenol A diglycidyl ether (for example, EPOLITE 4000 by Kyoeisha Chemical Co., Ltd.), and diglycidyl ethers having n1 mol and n2 mol of ethylene glycol and propylene glycol, respectively. The values for n1 and n2 in this diglycidyl ether may be the combinations listed in Table 1 below, for example.

TABLE 1

| Ethylene glycol number of moles (n1) | Propylene glycol number of moles (n2) |
|---|---|
| 1 | 2 |
| 1 | 3 |
| 1 | 4 |
| 1 | 5 |
| 1 | 9 |
| 2 | 1 |
| 2 | 2 |
| 2 | 3 |
| 2 | 4 |
| 2 | 5 |
| 2 | 8 |
| 3 | 1 |
| 3 | 2 |
| 3 | 3 |
| 3 | 4 |
| 3 | 5 |
| 3 | 7 |
| 5 | 1 |
| 5 | 2 |
| 5 | 3 |
| 5 | 4 |

TABLE 1-continued

| Ethylene glycol number of moles (n1) | Propylene glycol number of moles (n2) |
|---|---|
| 5 | 5 |
| 6 | 1 |
| 6 | 2 |
| 6 | 3 |
| 6 | 4 |
| 7 | 1 |
| 7 | 2 |
| 7 | 3 |
| 8 | 1 |
| 8 | 2 |
| 9 | 1 |

Examples of bisphenol A group-containing epoxy compounds include bisphenol A-propylene oxide 2-molar added diglycidyl ether (for example, EPOLITE 3002 by Kyoeisha Chemical Co., Ltd.), bisphenol A-propylene oxide 4-molar added diglycidyl ether, bisphenol A-propylene oxide 6-molar added diglycidyl ether, bisphenol A-propylene oxide 8-molar added diglycidyl ether, bisphenol A-propylene oxide 10-molar added diglycidyl ether, bisphenol A-ethylene oxide 2-molar added diglycidyl ether, bisphenol A-ethylene oxide 4-molar added diglycidyl ether, bisphenol A-ethylene oxide 6-molar added diglycidyl ether, bisphenol A-ethylene oxide 8-molar added diglycidyl ether and bisphenol A-ethylene oxide 10-molar added diglycidyl ether.

Compounds of hydrogenated bisphenol A group-containing compounds include hydrogenated bisphenol A-ethylene oxide 2-molar added diglycidyl ether, hydrogenated bisphenol A-ethylene oxide 4-molar added diglycidyl ether, hydrogenated bisphenol A-ethylene oxide 6-molar added diglycidyl ether, hydrogenated bisphenol A-ethylene oxide 8-molar added diglycidyl ether, hydrogenated bisphenol A-ethylene oxide 10-molar added diglycidyl ether, hydrogenated bisphenol A-propylene oxide 2-molar added diglycidyl ether, hydrogenated bisphenol A-propylene oxide 4-molar added diglycidyl ether, hydrogenated bisphenol A-propylene oxide 6-molar added diglycidyl ether, hydrogenated bisphenol A-propylene oxide 8-molar added diglycidyl ether and hydrogenated bisphenol A-propylene oxide 10-molar added diglycidyl ether.

Oxetane compounds include 1,4-bis{[(3-ethyl-3-oxetanyl)methoxy]methyl}benzene, bis[1-ethyl (3-oxetanyl)] methyl ether, 4,4'-bis[(3-ethyl-3-oxetanyl)methyl]biphenyl, 4,4'-bis(3-ethyl-3-oxetanylmethoxy)biphenyl, ethyleneglycol bis(3-ethyl-3-oxetanylmethyl)ether, diethyleneglycol bis(3-ethyl-3-oxetanylmethyl)ether, bis(3-ethyl-3-oxetanylmethyl) diphenoate, trimethylolpropanetris(3-ethyl-3-oxetanylmethyl)ether, pentaerythritoltetrakis(3-ethyl-3-oxetanylmethyl)ether, poly[[3-[(3-ethyl-3-oxetanyl)methoxy]propyl] silasesquioxane] derivatives, oxetanyl silicate, phenol-novolac-type oxetane, 1,3-bis[(3-ethyloxetane-3-yl)methoxy]benzene, OXT121 (trade name of ToaGosei Co., Ltd.) and OXT221 (trade name of ToaGosei Co., Ltd.), with no limitation to these.

From the viewpoint of heat resistance, 4,4'-bis[(3-ethyl-3-oxetanyl)methoxymethyl]biphenyl, 4,4'-bis(3-ethyl-3-oxetanylmethoxy)biphenyl and OXT121 (trade name of ToaGosei Co., Ltd.) are preferred.

Melamine compounds include trimethylolmelamine, hexamethylolmelamine, trimethoxymethylmelamine and hexamethoxymethylmelamine, with trimethoxymethylmelamine and hexamethoxymethylmelamine being preferred from the viewpoint of storage stability.

Compounds having the structure represented by formula (3) include compounds selected from the group consisting of structures represented by the following formula (7):

[Chemical Formula 8]

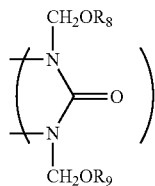

(7)

{wherein $R_8$ and $R_9$ each independently represent hydrogen or a group selected from among hydrocarbon groups of 1 to 10 carbon atoms and $R_{10}CO$— (where $R_{13}$ is a hydrocarbon group of 1 to 10 carbon atoms)}, and structures represented by the following formula (8):

[Chemical Formula 9]

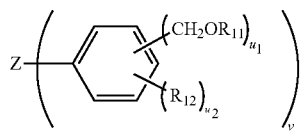

(8)

{wherein $R_{11}$ is hydrogen or a monovalent group selected from among methyl, ethyl, n-propyl and isopropyl groups, $R_{12}$ is hydrogen, hydroxyl, or at least one monovalent organic group selected from among alkyl groups of 1 to 4 carbon atoms, alkoxy groups, ester groups of 2 to 10 carbon atoms and urethane groups of 2 to 10 carbon atoms, $u_1$ is an integer of 1 to 5, $u_2$ is an integer of 0 to 4, with the proviso that $u_1+u_2=5$, v is an integer of 1 to 4, when v=1, Z is $CH_2OR_{11}$ or $R_{12}$, when v=2 to 4, Z is a single bond or a divalent to tetravalent organic group, and when multiple $CH_2OR_{11}$ and $R_{12}$ groups are present, $R_{10}$ and $R_{11}$ may be the same or different}.

Examples of compounds having structures represented by formula (7) include compounds selected from the group consisting of structures represented by the following formula (9).

[Chemical Formula 10]

(9)

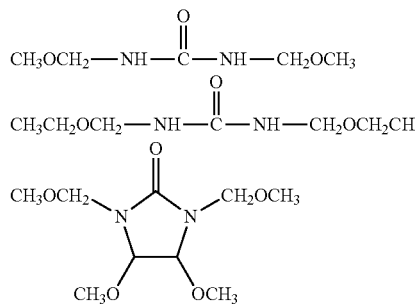

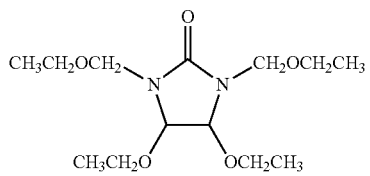

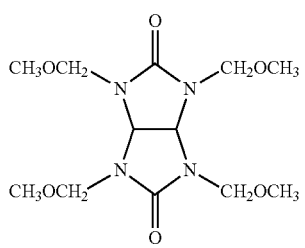

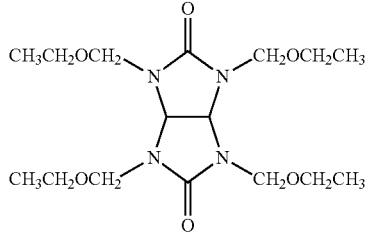

Examples of compounds having structures represented by formula (8) include compounds selected from the group consisting of structures represented by the following formula (10).

[Chemical Formula 11]

(10)

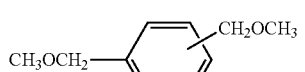

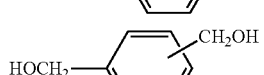

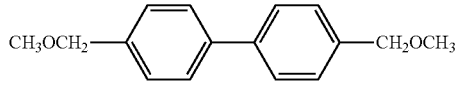

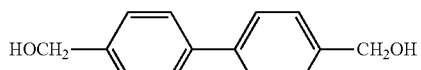

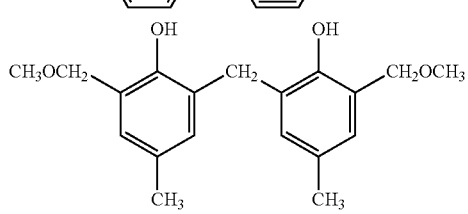

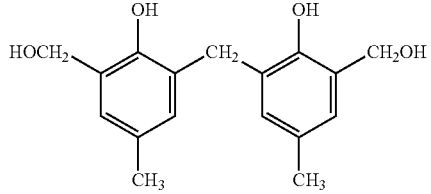

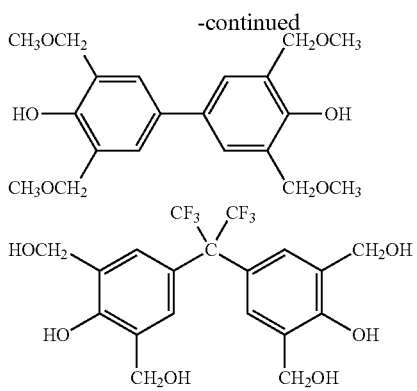

From the viewpoint of developability and reactivity, compounds selected from the group consisting of structures represented by formula (9) above are preferred.

Among the thermal crosslinking agents (D) mentioned above, from the viewpoint of resistance of the cured film to moist heat, adhesiveness with substrates and developability, it is preferred to use bismaleimide, or a compound selected from the group consisting of structures represented by formula (9), with bismaleimide being more preferred from the viewpoint of storage stability.

The content of the thermal crosslinking agent (D) in the photosensitive resin composition is preferably 0.2 mass % to 10 mass % with respect to 100 mass % as the total solid content in the photosensitive resin composition, and it is more preferably 1 mass % to 7 mass % and even more preferably 2 mass % to 5 mass %, from the viewpoint of obtaining satisfactory flexibility, resolution and hardness. The balance of performance will be satisfactory if the content of the thermal crosslinking agent (D) is in the range of 0.2 mass % to 10 mass %.

<Other Compounds>

For this embodiment of the invention, the photosensitive resin composition preferably further contains at least one compound selected from the group consisting of triazole compounds, thiadiazole compounds and tetrazole compounds (hereunder also referred to as "component (E)"), from the viewpoint of both rust resistance and developability.

Triazole compounds include benzotriazole, 1H-benzotriazole-1-acetonitrile, 5-carboxybenzotriazole, 1-(2-di-n-butylaminomethyl)-5-carboxybenzotriazole, 1-(2-di-n-butylaminomethyl)-6-carboxybenzotriazole, 1H-benzotriazole-1-methanol, carboxybenzotriazole, 1-hydroxybenzotriazole, mercapto group-containing triazole compounds such as 3-mercaptotriazole, and amino group-containing triazole compounds such as 3-amino-5-mercaptotriazole.

Thiadiazole compounds include 2-amino-5-mercapto-1,3,4-thiadiazole and 2,1,3-benzothiadiazole.

Specific examples of tetrazole compounds include 1H-tetrazole, 5-amino-1H-tetrazole, 5-methyl-1H-tetrazole, 1-methyl-5-ethyl-tetrazole, 1-methyl-5-mercapto-tetrazole and 1-carboxymethyl-5-mercapto-tetrazole.

Among these, component (E) is most preferably an amino group-containing triazole compound, a carboxyl group-containing triazole compound, a hydroxyl group-containing triazole compound or 5-amino-1H-tetrazole, from the viewpoint of reduced electrode corrosion, adhesiveness with metal electrodes, easy development and transparency.

For this embodiment, the content of component (E) in the photosensitive resin composition is preferably 0.05 mass % to 10 mass %, more preferably 0.1 mass % to 2.0 mass % and even more preferably 0.2 mass % to 1.0 mass %, with respect to 100 mass % as the total solid content of the photosensitive resin composition. If the content of component (E) is in the range of 0.05 mass % to 10 mass %, it will be possible to minimize problems such as reduction in developability or resolution, while obtaining an adequate effect of reducing electrode corrosion and improving adhesiveness with metal electrodes.

The photosensitive resin composition of this embodiment preferably includes a polymerization inhibitor (hereunder also referred to as "component (F)"), from the viewpoint of thermostability and storage stability.

Examples of polymerization inhibitors include p-methoxyphenol, hydroquinone, pyrogallol, naphthylamine, tert-butylcatechol, cuprous chloride, 2,6-di-tert-butyl-p-cresol, 2,2'-methylenebis(4-methyl-6-tert-butylphenol), 2,2'-methylenebis(4-ethyl-6-tert-butylphenol), nitrosophenylhydroxyamine aluminum salts and diphenylnitrosoamine.

For this embodiment, the content of the polymerization inhibitor (F) in the photosensitive resin composition is preferably 0.005 mass % to 1 mass %, more preferably 0.01 mass % to 0.5 mass % and even more preferably 0.02 mass % to 0.1 mass %, with respect to 100 mass % as the total solid content of the photosensitive resin composition. If the content of the polymerization inhibitor (F) is in the range of 0.005 mass % to 1 mass % it will be possible to ensure storage stability for the photosensitive resin composition without significantly reducing photo-crosslinkability.

If necessary, for this embodiment, a tackifier, such as a silane coupling agent, or a leveling agent, plasticizer, filler, antifoaming agent, flame retardant, stabilizer, antioxidant, aromatic, thermal crosslinking agent or the like may be added at about 0.01 part by mass to 20 parts by mass with respect to 100 parts by mass as the total of component (A) and component (B). Any of these may be used alone or in combinations of two or more.

<Photosensitive Resin Laminate>

A photosensitive resin laminate using the photosensitive resin composition described above will now be described. The photosensitive resin laminate includes a photosensitive resin layer composed of the photosensitive resin composition, and a support, and depending on the case may further include a protective film that protects the photosensitive resin layer. Specifically, a layer made of the photosensitive resin composition is laminated on a support, and when a protective film is necessary, a protective film is provided on the surface of the photosensitive resin layer opposite the support side.

The method of forming the photosensitive resin layer includes a step of coating and drying the coating solution on a support such as a PET film. The coating solution can be obtained by uniformly dissolving the photosensitive resin composition in a solvent.

Examples of solvents for dissolution of the photosensitive resin composition include ketones, typically methyl ethyl ketone (MEK); and alcohols, typically methanol, ethanol or isopropanol. The solvent is preferably added to the photosensitive resin composition so that the viscosity of the photosensitive resin composition solution coated onto the support is 10 mPa·s to 500 mPa·s at 25° C.

The coating method may be, for example, doctor blade coating, Meyer bar coating, roll coating, screen coating, spinner coating, ink-jet coating, spray coating, dip coating, gravure coating, curtain coating or die coating.

There are no particular restrictions on the drying conditions of the coating solution, but the drying temperature is preferably 50° C. to 130° C. and the drying time is preferably 30 seconds to 30 minutes.

The support of the photosensitive resin laminate will now be described. The support to be used is preferably a transparent one that transmits light emitted from the exposure light source. Examples of such support films include polyethylene terephthalate films, polyvinyl alcohol films, polyvinyl chloride films, vinyl chloride copolymer films, polyvinylidene chloride films, vinylidene chloride copolymerization films, polymethyl methacrylate copolymer films, polystyrene films, polyacrylonitrile films, styrene copolymer films, polyamide films and cellulose derivative films. These films may be used in stretched form if necessary. The haze is preferably no greater than 5. A smaller film thickness is advantageous for image formability and economy, but the range of 10 μm to 30 μm is preferred in order to maintain strength.

The protective film of the photosensitive resin laminate will now be described. It is an important property of the protective film, that the adhesive force on the photosensitive resin layer is sufficiently lower with respect to the protective film than with respect to the support film, to allow easier release. The protective film used may be a polymer film. Examples of polymer films include films that are composed of polyethylene, polypropylene, polyethylene-vinyl acetate copolymer, and polyethylene-vinyl acetate copolymer/polyethylene laminated films.

When the film is produced by a drawing method or casting method in which a material is melted by heat, kneaded and extruded, the protective film will include defects formed by undissolved or degraded components of the material that have become incorporated into the film (hereunder referred to as "fisheyes").

The fisheye diameter will differ depending on the material, but will usually be about 10 μm to 1 mm, with heights of about 1 to 50 μm from the film surface. The method of measuring the fisheye diameter may be conducted using an optical microscope, contact surface roughness meter or scanning electron microscope, for example. The "fisheye diameter" is the maximum diameter.

A smaller fisheye diameter in the protective film is preferred, and a lower number of fisheyes is also preferred. The number of fisheyes with diameters of 50 μm or greater is preferably no greater than $300/m^2$, more preferably no greater than $100/m^2$, and most preferably no greater than $50/m^2$. From the viewpoint of fisheyes, the polymer film is preferably formed of polypropylene.

The surface roughness of the protective film is preferably such that the center line average roughness Ra is 0.005 μm to 0.05 μm and more preferably 0.01 μm to 0.03 μm. The surface roughness can be measured using a contact surface roughness meter.

The film thickness of the protective film is preferably 5 μm to 100 μm, and from the viewpoint of storage as a wound roll, it is more preferably 10 μm to 70 μm and most preferably 15 μm to 50 μm. A film thickness of less than 5 μm will tend to hamper production of the protective film, and a film thickness of greater than 100 μm will tend to increase the cost of the protective film.

From the viewpoint of following wiring irregularities and ensuring rust resistance, the film thickness of the photosensitive resin layer is preferably 3 μm or greater as the post-drying thickness, and from the viewpoint of transparency and flexibility, it is preferably no greater than 20 μm and more preferably no greater than 10 μm.

As mentioned above, in pursuing a solution to the associated problems, the present inventors found, as a result of much ardent research, that a close relationship exists between the "tan δ peak top value, crosslink density and refractive index" and "both rust resistance and flexibility" of the cured photosensitive resin layer of the invention. The present inventors considered the correlation between these parameters and properties in the following manner.

First, the relationship between the Tan δ peak top value, crosslink density or refractive index and the rust resistance of the cured product will be explained. As mentioned above, when a touch panel or touch sensor is contacted with the fingertip, it can become infiltrated with corrosive components such as moisture and salts inside the sensing regions, leading to corrosion of the metal wiring and potential metal wire breakage. Increasing the rust resistance reduces infiltration of corrosive components such as moisture and salts, and the method employed to achieve this was to concentrate on the "refractive index (RI)" and "crosslink density ($n_{CD}$)".

The refractive index is controlled by the type and combination of the alkali-soluble polymer (A) and compound having an ethylenic unsaturated double bond (B), but presumably the major governing factor is the alkali-soluble polymer (A). The refractive index is in a strict correlation with the film density of the material, the refractive index tending to be higher with a higher film density. From the viewpoint of minimizing infiltration of corrosive components, a high refractive index is assumed to be preferable, but since development in an aqueous alkali solution is necessary for use as a photosensitive material, a preferred range presumably exists from the viewpoint of developability and rust resistance. The preferred range for the refractive index is 1.50 to 1.60 at a wavelength of 532 nm, more preferably 1.54 to 1.60 from the viewpoint of rust resistance, and even more preferably 1.55 to 1.58 from the viewpoint of balance between both properties. The refractive index referred to here is the refractive index measured by the method described below in the examples.

The crosslink density, on the other hand, while also being controlled by the type and combination of the alkali-soluble polymer (A) and compound having an ethylenic unsaturated double bond (B), is presumably governed mainly by the compound having an ethylenic unsaturated double bond (B). Since the crosslink density is also thought to be correlated with the film density of the material, similar to the refractive index, a higher crosslink density is presumably preferred from the viewpoint of minimizing infiltration of the aforementioned corrosive components.

However, as indicated by the following equality (1):

$$n_{CD} = \rho/Mc = E'\text{min}/3\Phi RT \tag{1}$$

{where E'min represents the minimum of the storage elastic modulus E' in the rubber range, Φ represents the front coefficient (nearly equal to 1), ρ represents the sample density, R represents the gas constant, T represents the absolute temperature of E'min, and Mc represents the molecular weight between crosslinks}, the crosslink density ($n_{CD}$) is proportional to the storage elastic modulus E', with a higher crosslink density being correlated with a higher storage elastic modulus E', and therefore greater hardness of the material and loss of flexibility, which is an important property according to the invention. Thus, a preferred range exists in which rust resistance can be imparted without significantly impairing the flexibility, the crosslink density being 1,000 to 8,000 $mol/m^3$, and more preferably 1,500 to 8,000 $mol/m^3$ or even more preferably 2,500 to 8,000 $mol/m^3$ if focus is on rust resistance. If the focus is on flexibility, on the other hand, it is more preferably 1,000 to 6,000 mol/m³ and even more preferably 1,000 to 4,000 mol/m³. The crosslink density referred to here is that determined by the dynamic viscoelasticity test method for thermosetting materials in accordance with JIS K7244-4, and the formula represented by equality (1), as explained below in the Examples.

When it is difficult to confirm the minimum storage elastic modulus E' in the rubber range, E'min is the minimum for the storage elastic modulus E' in the rubber range, within the measured temperature range.

From the viewpoint of both rust resistance and flexibility, the value of Tan δ (loss tangent) is an important parameter, together with the crosslink density. The value of Tan δ is the value calculated by the following equality (2):

$$\text{Tan } \delta = E''/E' \qquad (2)$$

from the loss elastic modulus E", and E' from dynamic viscoelasticity test results obtained according to the test method of JIS K7244-4, as for the crosslink density.

The temperature at which Tan δ is maximum, as determined according to equality (2), is defined as the glass transition temperature (Tg).

As seen in equality (2), the value of Tan δ increases as the loss elastic modulus E" increases over the storage elastic modulus E'. The significance of the size of Tan δ is how much greater the fluid component of the thermosetting material is than the solid component at a given temperature, and this would be expected to represent the shock absorption property of the material. Therefore, since a larger Tan δ corresponds to higher shock absorption, the thermosetting material would be expected to be more flexible. A larger Tan δ is thus also preferred from the viewpoint of flexibility. Consequently, the Tan δ peak top value is preferably 0.4 or greater and more preferably 0.43 or greater.

From the viewpoint of rust resistance, the Tg of the photosensitive resin layer following exposure is preferably below 100° C., and more preferably it is 65° C. or higher and lower than 100° C. General reliability testing of permanent materials that are intended to be used as electronic materials employ constant temperature and humidity testing under conditions of 65° C./90% RH, for example. If the Tg of the photosensitive resin layer following exposure is 65° C. or higher, a satisfactory result will be obtained in constant temperature and humidity testing. Also, if the Tg of the photosensitive resin layer following exposure is below 100° C., then when the exposed photosensitive resin layer is to be subsequently provided for heat treatment, the heating temperature may preferably be from 100° C. up to 150° C. in connection with the Tg of the substrate (for example, ITO), but since the heating temperature is sufficiently higher than the Tg of the photosensitive resin layer, thermal crosslinking reaction will proceed sufficiently and fewer unreacted ethylenic unsaturated double bonds will result, allowing the rust resistance to be more easily increased.

In light of these considerations, in order to obtain both rust resistance and flexibility, it is important for the photosensitive resin layer comprising a photosensitive resin composition including an alkali-soluble polymer (A), a compound having an ethylenic unsaturated double bond (B) and a photopolymerization initiator (C) to have a cured crosslink density of 1,000 to 8,000 mol/m³, a Tan δ peak top value of 0.4 or greater, and a refractive index in the range of 1.50 to 1.60 in the wavelength range of 532 nm, and it is also important for the Tg of the photosensitive resin layer following exposure to be below 100° C.

The specific conditions for measurement of these physical property values (refractive index, crosslink density and Tan δ) are described in the examples below.

For this embodiment, the photosensitive resin laminate is preferably used to form a protective film for a conductor component, in which case the conductor component is more preferably a copper electrode or transparent electrode. More specifically, the photosensitive resin laminate may be used as a protective film for a transparent electrode in the sensing region of a touch panel (touch sensor).

When the protective film is applied in a transparent electrode in the sensing region of a touch panel (touch sensor), which includes cases in which the protective film can be seen from the edges of the sensing region after a metal layer (such as a copper layer formed on an ITO electrode) has been protected in the frame region of a touch panel (touch sensor), reduction in the image display quality, color shade or brightness in the sensing region can be adequately reduced if the minimum visible light transmittance of the photosensitive resin layer coated on the panel at 400 nm to 700 nm is 90% or greater, more preferably 93% or greater and even more preferably 95% or greater.

The visible light transmittance of the photosensitive resin layer coated on the support can be determined in the following manner.

A coating solution containing the photosensitive resin composition on a support such as a PET film is applied to a post-drying thickness of 10 μm and dried to form a photosensitive resin layer. A laminator is then used for lamination onto a glass substrate, with the photosensitive layer in contact, to obtain a measuring sample having the photosensitive layer and support laminated on the glass substrate. The obtained measuring sample is then irradiated with ultraviolet rays for photocuring of the photosensitive layer, after which the PET film is released, heat treatment is continued, and the obtained protective film (cured photosensitive layer) is measured for transmittance in a wavelength range 400 nm to 700 nm using an ultraviolet and visible spectrophotometer.

Moreover, from the viewpoint of further improving the visibility of the touch panel, the CIELAB color system b* value for the photosensitive resin layer is preferably −0.2 to 1.0, more preferably 0.0 to 0.7 and even more preferably 0.1 to 0.5. The b* value is preferably −0.2 to 1.0 from the viewpoint of preventing reduction in image display quality and color shade in the sensing region, similar to the condition of a minimum visible light transmittance of 90% or greater. The b* value in the CIELAB color system can be determined using a CM-5 spectrocolorimeter by Konica Minolta Holdings, Inc., for example, forming a photosensitive resin layer with a thickness of 10 μm on a glass substrate with a thickness of 0.7 mm, irradiating it with ultraviolet rays to photocure the photosensitive resin layer, and then further subjecting it to heat treatment and performing measurement under conditions with a D65 light source and a viewing angle of 20.

Similarly, from the viewpoint of further improving the visibility of the touch panel, the haze value of the 2-layer film, measured in accordance with the method of JIS K 7136, is preferably no greater than 2%, more preferably no greater than 1% and even more preferably no greater than 0.5%.

[Resin Pattern and Method for its Production]

The method of forming a resist pattern using the photosensitive resin laminate may be a resin pattern production method including the following steps:

a laminating step in which the photosensitive resin laminate is laminated on a substrate;

an exposure step in which the laminated photosensitive resin laminate is exposed; and a developing step in which the exposed photosensitive resin laminate is developed.

In order to use the resin pattern as a protective film for a conductor component, the resin pattern production method preferably further includes, after the developing step, a step of providing the resin pattern for postexposure treatment and/or heat treatment to form a cured film pattern.

The substrate will be explained first. The substrate used may be a substrate having a copper wiring formed on a flexible copper-clad laminate, or a touch panel substrate or touch sensor substrate (for example, a force sensor) wherein a transparent electrode (such as ITO, an Ag nanowire substrate or the like) or a metal electrode has been formed on a glass substrate or transparent resin substrate. The substrate for formation of the flexible copper-clad laminate or touch panel electrode is a substrate comprising a copper layer on a flexible film.

The film may be one composed of a polyimide, polyester (PET, PEN), cycloolefin polymer (COP) or the like. The thickness of the film is preferably from 10 μm to 100 μm. The copper used may be pure copper, or an alloy composed mainly of copper. Examples of alloy metals include alloys of copper with nickel, palladium, silver, titanium and molybdenum. The thickness of the copper layer is preferably 50 nm to 2 μm. A thickness of 100 nm or greater is preferred from the viewpoint of uniformity of the copper layer.

A specific example of a resist pattern forming method will now be described.

The photosensitive resin layer is formed on a substrate, and preferably on the copper layer of a substrate, by a step of laminating the photosensitive resin laminate on the substrate. When the photosensitive resin laminate has a protective film, the protective film is released and then the photosensitive resin laminate is laminated onto the substrate surface by thermocompression bonding with a laminator. The bonding means may be a contact bonding roll, for example. A contact bonding roll may be provided with heating means to allow thermocompression bonding.

The heating temperature for thermocompression bonding is preferably 10° C. to 180° C., more preferably 20° C. to 160° C. and even more preferably 30° C. to 150° C., in order to help prevent thermosetting or thermal decomposition of the constituent components of the photosensitive resin laminate, while ensuring adequate adhesiveness between the photosensitive resin laminate and the substrate. Carrying out thermocompression bonding two or more times can improve the adhesiveness and chemical resistance. The thermocompression bonding may be carried out using a two-stage laminator provided with a double roll, or by repeatedly passing the photosensitive resin laminate and substrate several times through rolls. The photosensitive resin laminate may be laminated on only one side or on both sides of the substrate surface.

The contact bonding pressure during thermocompression bonding is preferably 50 N/m to $1\times10^5$ N/m, more preferably $2.5\times10^2$ N/m to $5\times10^4$ N/m and even more preferably $5\times10^2$ N/m to $4\times10^4$ N/m, as linear pressure, from the viewpoint of minimizing deformation of the touch panel substrate while ensuring adequate adhesiveness between the 2-layer film and touch panel substrate.

An exposure device is then used for the exposure step. If necessary, the support film may be released from the photosensitive resin laminate and exposed to active light through a photomask. The exposure dose is determined by the light source illuminance and exposure time. The exposure dose may be measured using an illuminometer. The exposure device may be a scattered light exposure device having a light source that efficiently emits ultraviolet rays, such as a carbon arc lamp, ultra-high-pressure mercury lamp, high-pressure mercury lamp or xenon lamp, a parallel light exposure system with an adjusted degree of parallelization, or a proximity exposure system having a gap formed between the mask and the work. It may also be a projection-type exposure device having a mask to image size ratio of 1:1, a reduction projection exposure system, such as a high illuminance Stepper, or an exposure device utilizing a concave mirror, such as a Mirror Projection Aligner®. The exposure dose of the active light rays will usually be 10 $mJ/cm^2$ to 1,000 $mJ/cm^2$, and irradiation may be accompanied by heating. If the active light ray exposure dose is less than 10 $mJ/cm^2$, the photocuring will tend to be insufficient, and if the active light ray exposure dose exceeds 1,000 $mJ/cm^2$, the photosensitive resin layer may undergo discoloration.

A direct writing exposure method may be used for the exposure step. Direct writing exposure is a method in which exposure is accomplished by direct writing on the substrate, without using a photomask. The light source used may be a solid-state laser, a semiconductor laser or an ultra-high-pressure mercury lamp, having a wavelength of 350 nm to 410 nm. The drawing pattern is computer-controlled. In this case, the exposure dose is determined by the light source illuminance and the traveling speed of the substrate.

The developing step is carried out next using a developing apparatus. After exposure, the support film on the photosensitive resin layer is removed if necessary, if it is present, and then the aqueous alkali developing solution is used to develop and remove the unexposed sections, to obtain a resist image. The aqueous alkali solution used is preferably an aqueous (alkali) solution of $Na_2CO_3$ or $K_2CO_3$. The aqueous alkali solution is selected as appropriate for the properties of the photosensitive resin layer, but it is preferably at a concentration of about 0.2 mass % to 5 mass %, and will generally be a $Na_2CO_3$ aqueous solution at a temperature of 20° C. to 40° C., for example. The aqueous alkali solution may also contain an added surfactant, an antifoaming agent, and a small amount of an organic solvent to accelerate development. Considering the effect on the substrate, an amine-based aqueous alkali solution such as aqueous tetraammonium hydroxide (TMAH) may be used. The concentration may be selected as appropriate depending on the developing speed. A 1 mass %, 30° C. $Na_2CO_3$ aqueous solution is particularly preferred from the viewpoint of low odor and excellent handleability, as well as easier management and post-treatment. The developing method used may be a known method, such as alkali water spraying, showering, reciprocal dipping, brushing or scrapping.

Following development, the base of the aqueous alkali solution remaining on the photocured 2-layer film may be subjected to acid treatment (neutralizing treatment) by a known method such as spraying, reciprocal dipping, brushing or scrapping, using an organic acid, an inorganic acid or an aqueous solution of such an acid.

Acid treatment (neutralizing treatment) may be followed by a step of rinsing of the photocured photosensitive resin layer.

[Cured Film Pattern and Method for its Production]

A resist pattern can be obtained from the steps of the resin pattern production method, and the cured film pattern obtained by subjecting the resist pattern to postexposure treatment and/or heat treatment may be used as a protective film for a conductor component (metal wiring or electrode).

For one aspect of the cured film having a prescribed pattern, the method includes the following steps:

a laminating step in which the photosensitive resin laminate described above is laminated on a substrate, an exposure step in which the laminated photosensitive resin laminate is exposed, and a developing step in which the exposed photosensitive resin laminate is developed to obtain a resin pattern;

and then a curing step in which the resin pattern is subjected to postexposure treatment and/or heat treatment to obtain a cured film pattern.

The cured film having a prescribed pattern obtained in the manner described above is preferably used as a protective film for a conductor component, and more preferably as a protective film for wiring or a protective film for a touch panel electrode.

The laminating step, exposure step and developing step may be carried out as explained above for the resin pattern production method. In the curing step, the exposure dose for postexposure treatment is preferably 200 mJ/cm$^2$ to 1,000 mJ/cm$^2$, and/or the temperature for heat treatment is preferably about 40° C. to 200° C. The heating temperature for heat treatment is preferably 40° C. to 200° C., more preferably 50° C. to 180° C. and even more preferably 60° C. to 150° C., so as to avoid heat-induced degradation of the substrate, the conductor component formed on the substrate, and the protective film composed of a photosensitive resin layer that protects them. The time for heat treatment is generally preferred to be no longer than 60 minutes, with a shorter time being preferred from the viewpoint of the production process. The postexposure and/or heat treatment can further increase the rust resistance. A heating furnace employing an appropriate method such as hot air, infrared rays or far-infrared rays may be used for heating, with a heating atmosphere of $N_2$ or $N_2/O_2$, but heat treatment in a $N_2$ atmosphere is preferred from the viewpoint of rust resistance.

A photosensitive resin laminate having satisfactory developability and transparency, and a satisfactory balance between rust resistance, flexibility and hardness, may be used for this embodiment. Such a photosensitive resin laminate is suitable as a protective film for wiring or electrodes in a touch panel or touch sensor, for example.

[Protective Film-Bearing Touch Panel Substrate]

A protective film-bearing touch panel substrate according to the invention will now be described. The aforementioned photosensitive resin layer may be laminated on a substrate comprising an electrode for a touch panel (touch sensor), to provide a protective film comprising the photosensitive resin layer. For this purpose as well, the protective film preferably satisfies the conditions of film thickness, visible light transmittance and CIELAB color system b* value mentioned above for the photosensitive resin layer.

The method for producing a substrate for a protective film-bearing touch panel according to the invention includes the following steps:

a first step in which a protective film comprising the aforementioned photosensitive resin layer is formed on a touch panel substrate having a touch panel electrode;

a second step in which prescribed sections of the protective film are irradiated with active light rays for curing;

a third step in which, following irradiation with active light rays, the sections other than the prescribed sections of the protective film (the sections of the protective film not irradiated with active light rays) are removed, to form a patterned protective film comprising the cured sections of the protective film, covering all or a portion of the electrodes; and a fourth step in which the touch panel substrate on which the patterned protective film has been formed is subjected to exposure and/or heat treatment. The method of producing the protective film-bearing touch panel substrate preferably includes the first step, second step, third step and fourth step in that order.

The touch panel substrate may be a common panel used for a touch panel or touch sensor, such as a glass plate, plastic sheet or ceramic sheet, for example. The electrode for a touch panel, on which the protective film is to be formed, is provided on the panel. The electrode may be an ITO, Cu, Al, Ag or Mo electrode, for example, or a thin-film transistor (TFT). An insulating layer may also be provided between the panel and the electrode.

A touch panel substrate comprising the electrode for a touch panel can be obtained by the following procedure, as an example. After the metal film has been formed on the touch panel substrate, such as a polyester or COP film, by sputtering of ITO and Cu in that order on the touch panel substrate, a photosensitive film for etching is attached onto the metal film and the desired resist pattern is formed, after which the unnecessary Cu is removed with an etching solution such as an iron chloride aqueous solution, and the resist pattern is subsequently detached and removed.

The first step to fourth step in the method of producing a substrate for a protective film-bearing touch panel are carried out by the method described above under <Resin pattern production method> and <Method for producing cured film pattern>.

As explained above, the photosensitive resin laminate of the invention is preferably used to form a protective film for a touch panel substrate.

[Touch Panel Display or Touch Sensor Device]

A protective film-bearing touch panel display device or touch sensor device according to the invention will now be described. By fabricating a touch panel substrate having a cured film pattern of a photosensitive resin laminate by the method described under <Substrate for protective film-bearing touch panel>, it is possible to provide a touch panel display having a cured photosensitive resin laminate film, or a device having a cured photosensitive resin laminate film and a touch sensor.

EXAMPLES

The invention will now be explained in detail through the following examples, with the understanding that these examples are not limitative on the invention.

Preparation of a binder polymer solution will be explained first.

<Preparation of Binder Polymer Solution (A1)>

In a flask equipped with a stirrer, reflux condenser, inert gas inlet and thermometer there was charged 100 mass % of ethyl methyl ketone, the temperature was raised to 75° C. under a nitrogen gas atmosphere, and 20 mass % of methacrylic acid, 80 mass % of benzyl methacrylate, and an azo-based polymerization initiator (V-601, product of Wako Pure Chemical Industries, Ltd.) were added dropwise in a uniform manner over a period of 2 hours. After the dropwise addition, the mixture was stirred at 75° C. for 10 hours, and upon completion of the reaction, the resin solution obtained using ethyl methyl ketone was diluted to obtain a binder polymer solution (A1) with 20 mass % of the (meth)acrylic acid-derived structural unit, a weight-average molecular weight of approximately 50,000, and an acid equivalent of 430 (50 mass % solid).

<Preparation of Binder Polymer Solution (A2)>

A binder polymer solution (A2) with a weight-average molecular weight of approximately 50,000 and an acid equivalent of 573 (50 mass % solid) was obtained by the same method as binder polymer (A1), using 15 mass % of methacrylic acid and 85 mass % of benzyl methacrylate.

<Preparation of Binder Polymer Solution (A3)>

A binder polymer solution (A3) with a weight-average molecular weight of approximately 70,000 and an acid equivalent of 450 (46 mass % solid) was obtained by the same method as binder polymer (A1), using 19 mass % of methacrylic acid, 58 mass % of benzyl methacrylate and 23 mass % of 2-ethylhexyl acrylate.

<Preparation of Binder Polymer Solution (A4)>

A binder polymer solution (A4) with a weight-average molecular weight of approximately 50,000 and an acid equivalent of 410 (40 mass % solid) was obtained by the same method as binder polymer (A1), using 21 mass % of methacrylic acid, 40 mass % of styrene and 39 mass % of methyl methacrylate.

<Preparation of binder polymer solution (A5)>

A binder polymer solution (A5) with a weight-average molecular weight of approximately 40,000 and an acid equivalent of 450 (45 mass % solid) was obtained by the same method as binder polymer (A1), using 19 mass % of methacrylic acid, 8 mass % of methyl methacrylate, 50 mass % of benzyl methacrylate and 23 mass % of lauryl acrylate.

<Preparation of Binder Polymer Solution (A6)>

A binder polymer solution (A6) with a weight-average molecular weight of approximately 160,000 and an acid equivalent of 373 (32 mass % solid) was obtained by the same method as binder polymer (A1), using 23 mass % of methacrylic acid, 67 mass % of methyl methacrylate and 10 mass % of n-butyl acrylate.

<Preparation of Binder Polymer Solution (A7)>

In a flask equipped with a stirrer, reflux condenser, inert gas inlet and thermometer there was charged 100 mass % of 1-methoxy-2-propanol (PGME), the temperature was raised to 90° C. under a nitrogen gas atmosphere, and 54 mass % of methacrylic acid, 46 mass % of cyclohexyl methacrylate, and an azo-based polymerization initiator (V-601, product of Wako Pure Chemical Industries, Ltd.) were added dropwise in a uniform manner over a period of 2 hours. After the dropwise addition, the mixture was stirred at 90° C. for 4 hours.

A small amount of hydroquinonemonomethyl ether and tetraethylammonium bromide was then added, and 34 mass % of glycidyl methacrylate was added dropwise over a period of 2 hours. After the dropwise addition, reaction was conducted at 90° C. for 4 hours while blowing in air, and upon completion of the reaction, a resin solution obtained using propylene glycol-1-monomethyl ether-2-acetate (PG-MEA) was diluted to obtain a binder polymer solution (A7) with a weight-average molecular weight of approximately 21,000 and an acid equivalent of 450 (45 mass % solid).

<Preparation of Binder Polymer Solution (A8)>

A binder polymer solution (A8) with a weight-average molecular weight of approximately 85,000 and an acid equivalent of 344 (39 mass % solid) was obtained by the same method as binder polymer (A1), using 25 mass % of methacrylic acid, 65 mass % of methyl methacrylate and 10 mass % of n-butyl acrylate.

Measurement of the weight-average molecular weight and acid equivalent was conducted by the method described in detail above under <Alkali-soluble polymer (A)>.

The method of fabricating the evaluation films for the examples and comparative examples will now be explained, followed by the evaluation method and evaluation results for each of the obtained films.

1. Fabrication of Evaluation Films

The evaluation films for the examples and comparative examples were fabricated in the following manner.

<Fabrication of Photosensitive Resin Laminate>

The components of the compositions shown in Tables 2 and 3 below were each weighed out in a 250 ml plastic bottle, ethyl methyl ketone was loaded in to a solid concentration of 49 mass %, and a stirrer was used for dissolved mixing over a period of 5 hours to obtain a photosensitive resin composition. The photosensitive resin composition was then passed through a 3 μm filter to prepare a photosensitive resin composition mixture (Examples 1 to 29 and Comparative Examples 1 to 10).

A photosensitive resin composition mixture (Comparative Example 11) was also prepared by the same method as described in International Patent Publication No. WO2014/024951, using an alkali-soluble resin and additives, with γ-butyrolactone as the solvent, to a solid concentration of 55 mass %.

The photosensitive resin composition mixture was evenly coated onto the surface of a 16 μm-thick polyethylene terephthalate film (FB40 by Toray Co., Ltd.) as the support using a blade coater, and drying was performed in a drier at 95° C. for 3 minutes or 6 minutes to form a homogeneous photosensitive resin layer on the support. The photosensitive resin layer thickness was 10 μm or 50 μm. Next, a 33 μm-thick polyethylene film (GF-858, by Tamapoly Co., Ltd.) was attached as a protective film to the surface of the photosensitive resin layer to obtain a photosensitive resin laminate. The evaluation results are shown in Tables 2 and 3. The names of the material components in the photosensitive resin composition mixture represented by the symbols in Tables 2 and 3 are shown in Table 4.

2. Dynamic Viscoelasticity Measurement

<Sample Fabrication Method>

A photosensitive resin laminate having a 50 μm-thick photosensitive resin layer was cut to 30 cm×20 cm, a negative pattern-forming mask with a size of 0.3 cm×4 cm was placed over it, and a scattered light exposure device (HMW-201 KB, product of Orc Manufacturing Co., Ltd.) was used for exposure from the support side, at the optimal exposure dose for each composition. After standing for 30 minutes or longer, the protective film was released, a developing apparatus by Fuji Kiko Co., Ltd. was used for development by spraying of a 1 mass % $Na_2CO_3$ aqueous solution at 30° C. for a prescribed time period, with a full cone type nozzle at a developing spray pressure of 0.15 MPa, and the unexposed sections of the photosensitive resin layer were dissolved and removed. After standing for 30 minutes following development, a scattered light exposure device was used for exposure at an exposure dose of 375 mJ/$cm^2$ from the photosensitive layer side, and after standing for another 30 minutes or longer, it was subjected to heat treatment at 150° C. for 30 minutes with a hot air circulation oven. After heat treatment, the photosensitive resin layer was released from the support and a 0.3 cm×4 cm sample was prepared. The prepared sample was humidified at 23° C., 50% RH for 1 day and then supplied for testing.

The optimal exposure dose is the exposure dose that leaves 6 steps remaining when exposure is through a Stouffer 21-step tablet (a step tablet with optical density of 0.00 as the first step, and increasing optical density of 0.15 with each step).

The prescribed time for the developing step was twice the minimum developing time, the minimum developing time being measured as the shortest time required to completely dissolve the unexposed sections of the photosensitive resin layer. The rinsing step was carried out with a flat type nozzle at a rinsing spray pressure of 0.15 MPa, for the same time period as the developing step.

<Evaluation Methods>

The dynamic viscoelasticity of a self-supporting film of the photosensitive resin layer fabricated by the method described above, was measured using a dynamic viscoelasticity measuring apparatus (DDV-01FP by A&D Co.), under the following conditions, and the crosslink density: $n_{CD}$ (mol/m³) and Tan δ peak top value were calculated from the obtained data.

Sample size: 0.3 cm×4 cm×50 μm (width x length x thickness)
Measuring temperature range: 25° C. to 150° C.
Temperature-elevating rate: 5° C./min
Load: 3.0 gf
Excitation frequency: 1 Hz
Excitation amplitude: 16 μm The crosslink density $n_{CD}$ was calculated using the formula indicated above as equation (1). For the measurement, since it is difficult to clearly confirm the minimum storage elastic modulus E'min in the rubber range, for all of the samples the crosslink density $n_{CD}$ was calculated using the storage elastic modulus E' at 150° C., as the minimum value of the storage elastic modulus E' in the measuring temperature range.

3. Refractive Index Measurement

<Sample Fabrication Method>

A photosensitive resin laminate with a 10 μm-thick photosensitive resin layer was cut to 5 cm×5 cm, and exposed from the support side at the optimal exposure dose for each composition. After standing for 30 minutes or longer, the protective film was released, a developing apparatus by Fuji Kiko Co., Ltd. was used for development by spraying of a 1 mass % $Na_2CO_3$ aqueous solution at 30° C. for a prescribed time period, with a full cone type nozzle at a developing spray pressure of 0.15 MPa, and the unexposed sections of the photosensitive resin layer were dissolved and removed. After standing for 30 minutes or longer following development, a scattered light exposure device was used for exposure from the photosensitive layer side with an exposure dose of 375 mJ/cm². After standing for another 30 minutes or longer, it was treated for 30 minutes with a hot air circulation oven at 150° C., to prepare a 5 cm×5 cm size sample. The optimal exposure dose and prescribed time are defined in the same way as for the method of fabricating the dynamic viscoelasticity measuring sample.

<Evaluation Methods>

The refractive index of a sample fabricated by the method described above was measured at 4 arbitrary locations in the planar direction of the sample and at 4 arbitrary locations in the perpendicular direction, using a refractive index measuring apparatus (Prism Coupler Model 2010/M by Metricon) with a 532 nm laser light source, and the mean value was calculated.

4. Flex Resistance Test

<Sample Fabrication Method>

A photosensitive resin laminate with a 10 μm-thick photosensitive resin layer was cut to 2 cm×20 cm, and a scattered light exposure device (HMW-201 KB by Orc Manufacturing Co., Ltd.) was used for exposure from the support side at the optimal exposure dose for each composition. After standing for 30 minutes or longer, the protective film was released, and a developing apparatus by Fuji Kiko Co., Ltd. was used for development by spraying of a 1 mass % $Na_2CO_3$ aqueous solution at 30° C. for a prescribed time period, with a full cone type nozzle at a developing spray pressure of 0.15 MPa. After standing for 30 minutes or longer following development, a scattered light exposure device was used for exposure from the photosensitive layer side with an exposure dose of 375 mJ/cm². After standing for another 30 minutes or longer, it was heat treated for 30 minutes with a hot air circulation oven at 150° C., to prepare a 2 cm×20 cm size sample. The evaluation sample was humidified at 23° C., 50% RH for 1 day and then supplied for testing. The optimal exposure dose and prescribed time are defined in the same way as for the method of fabricating the dynamic viscoelasticity measuring sample.

<Evaluation Method>

As shown in FIG. 1, the prepared sample was folded at an angle of 90° around a circular cylindrical mandrel 2 having a different fixed φ as the fulcrum, with the photosensitive layer on the outer side, and after holding this position for 1-2 seconds it was restored (1 cycle), the cycle being repeated 10 times. The sample was then observed, using a microscope, for the presence or absence of peeling or cracking of the photosensitive layer, and assessed in the following manner.
A: No cracking or peeling observed with 0.5 mmφ mandrel.
B: No cracking or peeling observed with 1 mmφ mandrel.
C: No cracking or peeling observed with 2 mmφ mandrel.
D: No cracking or peeling observed with 3 mmφ mandrel.
E: Cracking or peeling observed with 3 mmφ mandrel.

The results were considered satisfactory if the flex resistance test indicated no observable cracking or peeling with a 2 mmφ mandrel.

No cracking or peeling was observed with a 2 mmφ mandrel in any of Examples 1 to 29, but cracking or peeling was observed with a 2 mmφ mandrel in Comparative Examples 1, 3, 5, 8 and 10.

5. Pencil Hardness Test

<Sample Fabrication Method>

While releasing the protective film from a photosensitive resin laminate with a 10 μm-thick photosensitive resin layer, it was laminated on a 10 cm×10 cm×1 mm glass plate (TEMPAX Float) using a hot roll laminator (VA-400III by Taisei Laminator Co., Ltd.), with a roll temperature of 100° C. The air pressure was 0.4 MPa and the laminating speed was 1.0 m/min. A scattered light exposure device (HMW-201 KB by Orc Manufacturing Co., Ltd.), was used for exposure at the optimal exposure dose for each composition. After standing for 30 minutes or longer, the support was removed, and a developing apparatus by Fuji Kiko Co., Ltd. was used for development by spraying of a 1 mass % $Na_2CO_3$ aqueous solution at 30° C. for a prescribed time period, with a full cone type nozzle at a developing spray pressure of 0.15 MPa. After standing for 30 minutes or longer following development, a scattered light exposure device was used for exposure from the photosensitive layer side with an exposure dose of 375 mJ/cm². After standing for another 30 minutes or longer, it was heat treated for 30 minutes with a hot air circulation oven at 150° C., to prepare a sample. The evaluation sample was humidified at 23° C., 50% RH for 1 day and then supplied for testing. The optimal exposure dose and prescribed time are defined in the same way as for the method of fabricating the dynamic viscoelasticity measuring sample.

<Evaluation Method>

The fabricated evaluation sample was subjected to a pencil hardness test according to JIS K5600-5-4 (ISO/DIN 15184), using a Clemens-type scratch hardness tester (product of Tester Sangyo Co., Ltd.), with a speed of 0.5 mm/sec, a scratch width of 1 cm and a load of 750 g, and assessed in the following manner.

A: No film peeling at a hardness of 3H or below (also acceptable with a scratch in the sample surface if the scratch did not reach up to the glass of the substrate).
B: No observable film peeling at a hardness of 2H or below.
C: No observable film peeling at a hardness of H or below.
D: No observable film peeling at a hardness of F or below.
E: Observable film peeling at a hardness of F or below.

The results were considered satisfactory if the pencil hardness test indicated no observable film peeling at a hardness of H or below.

No film peeling was observed at a hardness of H or below in any of Examples 1 to 29, but film peeling was observed at a hardness of H or below in Comparative Examples 2, 6, 7 and 9.

6. Salt Water Test

<Sample Fabrication Method>

While releasing the protective film from a photosensitive resin laminate with a 10 μm-thick photosensitive resin layer, a hot roll laminator (VA-400III by Taisei Laminator Co., Ltd.) was used for lamination onto the copper surface of a panel having a resin, ITO and sputtered copper laminated in that order (size: 3 cm×3 cm). The roll temperature was 100° C., the air pressure was 0.4 MPa and the laminating speed was 1.0 m/min. A scattered light exposure device (HMW-201 KB by Orc Manufacturing Co., Ltd.), was used for exposure at the optimal exposure dose for each composition. After standing for 30 minutes or longer, the support was removed, and a developing apparatus by Fuji Kiko Co., Ltd. was used for development by spraying of a 1 mass % $Na_2CO_3$ aqueous solution at 30° C. for a prescribed time period, with a full cone type nozzle at a developing spray pressure of 0.15 MPa. After standing for 30 minutes or longer following development, a scattered light exposure device was used for exposure from the photosensitive layer side with an exposure dose of 375 mJ/cm$^2$. After standing for another 30 minutes or longer, it was heat treated for 30 minutes with a hot air circulation oven at 150° C., to prepare a sample. The evaluation sample was humidified at 23° C., 50% RH for 1 day and then supplied for testing. The optimal exposure dose and prescribed time are defined in the same way as for the method of fabricating the dynamic viscoelasticity measuring sample.

<Evaluation Method>

The treated sample was affixed with polyimide tape to the bottom of a sealable container, with the photosensitive resin side facing upward. A 5 mass % sodium chloride solution was added to immerse the sample, the container was capped, and it was allowed to stand for 24 hours in an isothermal oven at 65° C. The state of the sample after an elapse of 24 hours was ranked on the following scale.

A: No corrosion or discoloration of Cu on substrate surface.
B: Corrosion or discoloration of Cu on substrate surface less than 5% of total area.
C: Corrosion or discoloration of Cu on substrate surface less than 10% of total area.
D: Corrosion or discoloration of Cu on substrate surface less than 15% of total area.
E: Corrosion or discoloration of Cu on substrate surface 15% or more of total area.

The results were considered satisfactory if the salt water test indicated corrosion or discoloration of Cu on the substrate surface but less than 10% of the total area.

Corrosion or discoloration of Cu on the substrate surface was less than 10% of the total area in all of Examples 1 to 29, but corrosion or discoloration of Cu on the substrate surface was observed over at least 10% of the total area in Comparative Examples 2 to 4 and Comparative Examples 6, 7 and 9.

7. Cross-Cut Test

<Sample Fabrication Method>

While releasing the protective film from a photosensitive resin laminate with a 10 μm-thick photosensitive resin layer, a hot roll laminator (VA-400III by Taisei Laminator Co., Ltd.) was used for lamination onto the copper surface of a panel having a resin, ITO and sputtered copper laminated in that order (size: 3 cm×3 cm). The roll temperature was 100° C., the air pressure was 0.4 MPa and the laminating speed was 1.0 m/min. A scattered light exposure device (HMW-201 KB by Orc Manufacturing Co., Ltd.), was used for exposure at the optimal exposure dose for each composition. After standing for 30 minutes or longer, the support was removed, and a developing apparatus by Fuji Kiko Co., Ltd. was used for development by spraying of a 1 mass % $Na_2CO_3$ aqueous solution at 30° C. for a prescribed time period, with a full cone type nozzle at a developing spray pressure of 0.15 MPa. After standing for 30 minutes or longer following development, a scattered light exposure device was used for exposure from the photosensitive layer side with an exposure dose of 375 mJ/cm$^2$. After standing for another 30 minutes or longer, it was heat treated for 30 minutes with a hot air circulation oven at 150° C., to prepare a sample. The evaluation sample was humidified at 23° C., 50% RH for 1 day and then supplied for testing. The optimal exposure dose and prescribed time are defined in the same way as for the method of fabricating the dynamic viscoelasticity measuring sample.

<Evaluation Method>

The treated sample was subjected to a 100 grid cross-cut test, with reference to JIS K5400. A 1×1 mm square grid notch was formed using a cutter knife on the test side, Mending Tape #810 (product of 3M Co.) was firmly contact bonded to the grid section, and an edge of the tape was gently pulled off at an angle of approximately 0°, after which the state of the grid was observed, and the crosscut adhesiveness was evaluated on the following scale.

A: Almost no peeling over the total area.
B: Peeling over less than 5% of the total area.
C: Peeling over 5 to 15% of the total area.
D: Peeling over 15 to 35% of the total area.
E: Peeling over 35% or more of the total area.

The results were considered satisfactory if the cross-cut test indicated peeling over less than 5% of the total area.

The film peeling was less than 5% of the total area in all of Examples 1 to 29, but film peeling was observed over 5% or more in Comparative Example 10.

8. Thermogravimetric Reduction Measurement

<Sample Fabrication Method>

The protective film of a photosensitive resin laminate with a 50 μm-thick photosensitive resin layer was released, the photosensitive resin layer sides were folded together, and the photosensitive resin layer alone was detached from the support, to obtain a 15 mg photosensitive resin layer.

<Evaluation Method>

The sample was placed in an aluminum cell, and a thermal analyzer (DTG-60A by Shimazu) was used to measure the thermogravimetric reduction under the following conditions.
Sample weight: 15 mg
Measuring temperature range: 25° C. to 150° C. (holding for 10 minutes at 100° C./holding for 30 minutes at 150° C.)
Temperature-elevating rate: 10° C./min
Atmosphere: $N_2$, 50 ml/min With the photosensitive resin composition mixture described in International Patent Publication No. WO2014/024951 (Comparative Example 11), the thermogravimetric reduction was approximately 4.3% under the measuring temperature range, but in all of Examples 1 to 29, the results were satisfactory with thermogravimetric reduction of less than 1.5%.

9. Transmittance Measurement
<Sample Fabrication Method>

While releasing the protective film from a photosensitive resin laminate with a 10 μm-thick photosensitive resin layer, it was laminated on a 10 cm×10 cm×1 mm glass plate (TEMPAX Float) using a hot roll laminator (VA-400III by Taisei Laminator Co., Ltd.), with a roll temperature of 100° C. The air pressure was 0.4 MPa and the laminating speed was 1.0 m/min. A scattered light exposure device (HMW-201 KB by Orc Manufacturing Co., Ltd.), was used for exposure at the optimal exposure dose for each composition. After standing for 30 minutes or longer, the support was removed, and a developing apparatus by Fuji Kiko Co., Ltd. was used for development by spraying of a 1 mass % $Na_2CO_3$ aqueous solution at 30° C. for a prescribed time period, with a full cone type nozzle at a developing spray pressure of 0.15 MPa. After standing for 30 minutes or longer following development, a scattered light exposure device was used for exposure from the photosensitive layer side with an exposure dose of 375 mJ/cm². After standing for another 30 minutes or longer, it was heat treated for 30 minutes with a hot air circulation oven at 150° C., to prepare a sample. The evaluation sample was humidified at 23° C., 50% RH for 1 day and then supplied for testing. The optimal exposure dose and prescribed time are defined in the same way as for the method of fabricating the dynamic viscoelasticity measuring sample.

<Evaluation Method>

The fabricated evaluation sample was used for measurement of the transmittance. For the transmittance measurement, the total transmittance at 400 nm to 700 nm was measured using a UV spectrometer (U-3010 by Hitachi High-Tech Science), in accordance with JIS K7361-1. The transmittance at 400 nm to 700 nm was 90% or greater in all of Examples 1 to 29.

10. Haze Measurement
<Sample Fabrication Method>

While releasing the protective film from a photosensitive resin laminate with a 10 μm-thick photosensitive resin layer, it was laminated on a 10 cm×10 cm×1 mm glass plate (TEMPAX Float) using a hot roll laminator (VA-400III by Taisei Laminator Co., Ltd.), with a roll temperature of 100° C. The air pressure was 0.4 MPa and the laminating speed was 1.0 m/min. A scattered light exposure device (HMW-201 KB by Orc Manufacturing Co., Ltd.), was used for exposure at the optimal exposure dose for each composition. After standing for 30 minutes or longer, the support was removed, and a developing apparatus by Fuji Kiko Co., Ltd. was used for development by spraying of a 1 mass % $Na_2CO_3$ aqueous solution at 30° C. for a prescribed time period, with a full cone type nozzle at a developing spray pressure of 0.15 MPa. After standing for 30 minutes or longer following development, a scattered light exposure device was used for exposure from the photosensitive layer side with an exposure dose of 375 mJ/cm². After standing for another 30 minutes or longer, it was heat treated for 30 minutes with a hot air circulation oven at 150° C., to prepare a sample. The evaluation sample was humidified at 23° C., 50% RH for 1 day and then supplied for testing. The optimal exposure dose and prescribed time are defined in the same way as for the method of fabricating the dynamic viscoelasticity measuring sample.

<Evaluation Method>

The fabricated evaluation sample was used for measurement of the haze. A haze meter (NDH2000 Turbidimeter by Nippon Denshoku Industries Co., Ltd.) was used for the haze measurement, in accordance with JIS K7136. The haze value was 0.5% or smaller in all of Examples 1 to 29.

TABLE 2

| | | Examples (all contents as pts by mass) | | | | | | | | | |
|---|---|---|---|---|---|---|---|---|---|---|---|
| | | 1 | 2 | 3 | 4 | 5 | 6 | 7 | 8 | 9 | 10 |
| (A) Component | (A1) | 50 | 50 | 35 | 35 | 35 | 35 | 35 | 25 | | |
| | (A2) | | | 15 | 15 | 15 | 15 | 15 | 25 | | |
| | (A3) | | | | | | | | | 50 | 50 |
| | (A4) | | | | | | | | | | |
| | (A5) | | | | | | | | | | |
| | (A6) | | | | | | | | | | |
| | (A7) | | | | | | | | | | |
| | (A8) | | | | | | | | | | |
| | (A9) | | | | | | | | | | |
| (B) Component | (B1) | 15 | | 10 | 10 | | | 10 | 10 | 15 | 15 |
| | (B2) | | | | | | | | 5 | | |
| | (B3) | | 15 | | | 10 | | | | | |
| | (B4) | | | | | | 15 | | | | |
| | (B5) | 15 | 15 | 15 | | | | | | | |
| | (B6) | | | | 15 | 15 | 10 | 15 | 5 | | 5 |
| | (B7) | | | | | | | | 5 | | |
| | (B8) | | | | | | | | | | 5 |
| | (B9) | 10 | 10 | 15 | | 15 | 15 | | | 15 | 15 |
| | (B10) | | | | 15 | | | 15 | 15 | | |
| | (B11) | | | | | | | | | | |
| | (B12) | | | | | | | | | | |
| | (B13) | | | | | | | | | | |

TABLE 2-continued

| | | | | | | | | | | | |
|---|---|---|---|---|---|---|---|---|---|---|---|
| | (B14) | | | | | | | | 10 | | |
| | (B15) | | | | | | | | | | |
| | (B16) | | | | | | | | | | |
| | (B17) | | | | | | | | | | |
| | (B18) | | | | | | | | | | |
| (C) Component | (C1) | | | 0.6 | 0.6 | 0.6 | 0.6 | 0.6 | 0.6 | 0.6 | |
| | (C2) | | | | | | | 0.2 | | | |
| | (C3) | 0.6 | 0.6 | | 0.2 | | | | | | 0.6 |
| (D) Component | (D1)–(D7) | | | | | | | | | | |
| (E) Component | (E1) | | | 0.5 | | 0.5 | 0.5 | | 0.5 | 0.5 | |
| | (E2) | | | | | | | 0.3 | | | |
| | (E3) | 0.5 | 0.5 | | | | | | | | |
| | (E4) | | | | 0.5 | | | | | | 0.5 |
| (F) Component | (F1) | 0.01 | 0.01 | 0.01 | 0.01 | 0.01 | 0.01 | 0.01 | 0.01 | 0.01 | 0.01 |
| Crosslink density: $n_{CD}$ (mol/m$^2$) | | 2,900 | 2,750 | 2,500 | 2,750 | 2,200 | 2,650 | 2,950 | 2,100 | 2,550 | 1,420 |
| Tanδ peak top value | | 0.418 | 0.421 | 0.431 | 0.425 | 0.453 | 0.423 | 0.412 | 0.472 | 0.430 | 0.495 |
| Refractive index | | 1.56 | 1.56 | 1.56 | 1.56 | 1.56 | 1.56 | 1.56 | 1.55 | 1.56 | 1.55 |
| Flex resistance | | B | B | A | B | A | A | B | A | B | A |
| Pencil hardness | | B | B | B | A | B | A | A | B | A | B |
| Salt water test | | B | B | B | B | B | B | B | B | B | B |
| Adhesiveness | | A | A | A | A | A | B | B | A | A | A |

| | | Examples (all contents as pts by mass) | | | | | | | | |
|---|---|---|---|---|---|---|---|---|---|---|
| | | 11 | 12 | 13 | 14 | 15 | 16 | 17 | 18 | 19 |
| (A) Component | (A1) | | | | | | | 20 | | |
| | (A2) | | | | | 35 | 25 | | 15 | |
| | (A3) | 50 | | | | 15 | 25 | 15 | 15 | |
| | (A4) | | 50 | 50 | | | | | | |
| | (A5) | | | | 50 | | | | 15 | |
| | (A6) | | | | | | | | 20 | |
| | (A7) | | | | | | | | | 50 |
| | (A8) | | | | | | | | | |
| | (A9) | | | | | | | | | |
| (B) Component | (B1) | 10 | 10 | 15 | 15 | 25 | 20 | 15 | 15 | 10 |
| | (B2) | | | | | | | | | |
| | (B3) | | | | 10 | | | 5 | 10 | |
| | (B4) | 10 | | | | | | | | |
| | (B5) | | | | | | | | | |
| | (B6) | | 15 | 10 | | 5 | 5 | 5 | 5 | 10 |
| | (B7) | | | | | | | | | 5 |
| | (B8) | | | | | 5 | | | | |
| | (B9) | 20 | | 15 | 15 | 5 | 15 | 15 | 10 | |
| | (B10) | | 15 | | | | | | | 10 |
| | (B11)–(B14) | | | | | | | | | |
| | (B15) | | | | | | | | | 5 |
| | (B16)–(B18) | | | | | | | | | |
| (C) Component | (C1) | 0.6 | 0.6 | 0.6 | 0.6 | 0.6 | 0.6 | 0.6 | | |
| | (C2) | 0.2 | | | | | | | | |
| | (C3) | | | | | | | | 0.6 | 0.6 |
| (D) Component | (D1)–(D7) | | | | | | | | | |
| (E) Component | (E1) | | | | | 0.5 | 0.5 | 0.5 | 0.5 | |
| | (E2) | 0.3 | | | | | | | | |
| | (E3) | | | 0.5 | 0.5 | | | | | 0.5 |
| | (E4) | | | | | | | | 0.5 | |
| (F) Component | (F1) | 0.01 | 0.01 | 0.01 | 0.01 | 0.01 | 0.01 | 0.01 | 0.01 | 0.01 |
| Crosslink density: $n_{CD}$ (mol/m$^2$) | | 4,550 | 2,300 | 2,850 | 2,450 | 5,150 | 3,400 | 2,050 | 3,300 | 3,850 |

TABLE 2-continued

| | | | | | | | | | |
|---|---|---|---|---|---|---|---|---|---|
| Tanδ peak top value | 0.411 | 0.432 | 0.415 | 0.428 | 0.403 | 0.416 | 0.456 | 0.409 | 0.402 |
| Refractive index | 1.56 | 1.56 | 1.56 | 1.54 | 1.55 | 1.55 | 1.55 | 1.54 | 1.52 |
| Flex resistance | B | A | B | A | B | B | A | B | C |
| Pencil hardness | A | B | B | B | A | B | B | C | B |
| Salt water test | A | B | A | B | A | A | B | B | B |
| Adhesiveness | A | A | B | A | A | A | A | A | B |

TABLE 3

| | | Examples (all contents as pts by mass) | | | | | | | | | |
|---|---|---|---|---|---|---|---|---|---|---|---|
| | | 20 | 21 | 22 | 23 | 24 | 25 | 26 | 27 | 28 | 29 |
| (A) Component | (A1) | 20 | 50 | 35 | | | | | | | 20 |
| | (A2) | | | 15 | | | | | | 15 | |
| | (A3) | | | | 50 | 50 | | | | 15 | |
| | (A4) | | | | | | 50 | 50 | | | |
| | (A5) | | | | | | | | 50 | | |
| | (A6) | | | | | | | | | 20 | |
| | (A7) | 30 | | | | | | | | | 30 |
| | (A8) | | | | | | | | | | |
| | (A9) | | | | | | | | | | |
| (B) Component | (B1) | 10 | 15 | 10 | 15 | 15 | 10 | 15 | 15 | 15 | 10 |
| | (B2) | | | | | | | | | | |
| | (B3) | | | | | | | | 10 | 10 | |
| | (B4) | | | | | | | | | | |
| | (B5) | | 15 | 15 | | | | | | | |
| | (B6) | 20 | | | | 5 | 15 | 10 | | 5 | 20 |
| | (B7) | | | | | | | | | | |
| | (B8) | | | | | 5 | | | | | |
| | (B9) | 10 | 10 | 15 | 15 | 15 | | 15 | 15 | 10 | 10 |
| | (B10) | | | | | | 15 | | | | |
| | (B11) | | | | | | | | | | |
| | (B12) | | | | | | | | | | |
| | (B13) | | | | | | | | | | |
| | (B14) | | | | 10 | | | | | | |
| | (B15) | | | | | | | | | | |
| | (B16) | | | | | | | | | | |
| | (B17) | | | | | | | | | | |
| | (B18) | | | | | | | | | | |
| (C) Component | (C1) | 0.6 | | 0.6 | 0.6 | | 0.6 | 0.6 | 0.6 | | 0.6 |
| | (C2) | | | | | | | | | | |
| | (C3) | | 0.6 | | | 0.6 | | | | 0.6 | |
| (D) Component | (D1) | | | 5 | | | | | | 5 | |
| | (D2) | | 5 | | 5 | 5 | | 5 | 10 | | |
| | (D3) | | | | | | 3 | | 3 | 2 | |
| | (D4) | | 2 | | | | | 2 | | | |
| | (D5) | | | | | 5 | | | | | |
| | (D6) | | | | | | | | | | |
| | (D7) | | | | | | 2 | | 2 | | |
| (E) Component | (E1) | | | 0.5 | 0.5 | | | | 0.5 | | |
| | (E2) | | | | | | | | | | |
| | (E3) | | 0.5 | | | | 0.5 | 0.5 | | | |
| | (E4) | 0.5 | | | | 0.5 | | | | 0.5 | 0.5 |
| (F) Component | (F1) | 0.01 | 0.01 | 0.01 | 0.01 | 0.01 | 0.01 | 0.01 | 0.01 | 0.01 | 0.01 |
| Crosslink density ($n_{CD}$) | | 2,800 | 3,000 | 2,400 | 2,700 | 1,000 | 2,700 | 2,850 | 2,850 | 3,500 | 3,700 |
| Tanδ | | 0.413 | 0.412 | 0.420 | 0.413 | 0.465 | 0.419 | 0.408 | 0.412 | 0.406 | 0.404 |
| Refractive index | | 1.54 | 1.57 | 1.57 | 1.57 | 1.56 | 1.56 | 1.57 | 1.57 | 1.55 | 1.55 |
| Flex resistance | | B | B | B | B | B | B | B | B | B | B |
| Pencil hardness | | C | A | A | A | A | A | A | B | B | B |
| Salt water test | | C | A | A | A | A | A | A | A | A | B |
| Adhesiveness | | A | A | B | B | A | A | B | A | A | A |

| | | Comp. Examples (all contents as pts by mass) | | | | | | | | | |
|---|---|---|---|---|---|---|---|---|---|---|---|
| | | 1 | 2 | 3 | 4 | 5 | 6 | 7 | 8 | 9 | 10 |
| (A) Component | (A1) | 50 | 35 | 35 | | | | | | | |
| | (A2) | | 15 | 15 | | | | | | | |
| | (A3) | | | | 50 | | | | | | |
| | (A4) | | | | | 50 | | | | | |
| | (A5) | | | | | | 50 | | | | |
| | (A6) | | | | | | | 50 | | | |
| | (A7) | | | | | | | | 50 | | |
| | (A8) | | | | | | | | | 55 | |
| | (A9) | | | | | | | | | | 50 |
| | (B1) | 40 | | | | | | | | | |

TABLE 3-continued

| | | 1 | 2 | 3 | 4 | 5 | 6 | 7 | 8 | 9 | 10 |
|---|---|---|---|---|---|---|---|---|---|---|---|
| (B) Component | (B2) | | | | | | | 10 | | | |
| | (B3) | | | | | | | | | | |
| | (B4) | | | | 15 | | | | | | |
| | (B5) | | | | | | 20 | | | | |
| | (B6) | 40 | | | | | | | | | |
| | (B7) | | | | | | | | 20 | | |
| | (B8) | | | | | | | | | | |
| | (B9) | | | 10 | 10 | | | | | | |
| | (B10) | | | | 15 | | | | | | |
| | (B11) | | | | | | | | | 15 | |
| | (B12) | | | | | | | | | 35 | |
| | (B13) | | | | | | | | | | 50 |
| | (B14) | | | | | | | | | | |
| | (B15) | | | | | | 20 | 20 | 15 | | |
| | (B16) | | | 15 | | | | | 15 | | |
| | (B17) | | | | | | 15 | | 10 | | |
| | (B18) | | | 15 | 15 | | | | | | |
| (C) Component | (C1) | 0.6 | 0.6 | 0.6 | 0.6 | 0.6 | 0.6 | | 0.6 | 0.6 | 0.6 |
| | (C2) | | | | | | | | | | |
| | (C3) | | | | | | | 0.6 | | | |
| (D) Component | (D1) | | | | | | | | | | |
| | (D2) | | | | | | | | | | |
| | (D3) | | | | | | | | | | |
| | (D4) | | | | | | | | | | |
| | (D5) | | | | | | | | | | |
| | (D6) | 5 | | | | | | | | | |
| | (D7) | | | | | | | | | | |
| (E) Component | (E1) | 0.5 | 0.5 | 0.5 | 0.5 | 0.5 | 0.5 | 0.5 | 0.5 | 0.5 | 0.5 |
| | (E2) | | | | | | | | | | |
| | (E3) | | | | | | | | | | |
| | (E4) | | | | | | | | | | |
| (F) Component | (F1) | 0.01 | 0.01 | 0.01 | 0.01 | 0.01 | 0.01 | 0.01 | 0.01 | 0.01 | 0.01 |
| Crosslink density ($n_{CD}$) | | 9,050 | 850 | 2,900 | 2,600 | 3,500 | 900 | 650 | 4,120 | 2,570 | 2,120 |
| Tanδ | | 0.235 | 0.512 | 0.365 | 0.381 | 0.325 | 0.487 | 0.547 | 0.346 | 0.264 | 0.286 |
| Refractive index | | 1.55 | 1.53 | 1.55 | 1.54 | 1.55 | 1.54 | 1.51 | 1.52 | 1.49 | 1.61 |
| Flex resistance | | E | A | D | C | E | A | A | E | A | E |
| Pencil hardness | | A | E | B | C | C | E | E | C | E | B |
| Salt water test | | A | E | E | D | C | E | E | C | E | C |
| Adhesiveness | | B | A | B | B | A | A | A | B | A | C |

TABLE 4

| Symbols | Description |
|---|---|
| (A1) | Methacrylic acid/benzyl methacrylate = 20/80 (weight) copolymer, 50% solid MEK solution<br>Weight-average molecular weight: 50,000, acid equivalent: 430 |
| (A2) | Methacrylic acid/benzyl methacrylate = 15/85 (weight) copolymer, 50% solid MEK solution<br>Weight-average molecular weight: 50,000, acid equivalent: 573 |
| (A3) | Methacrylic acid/benzyl methacrylate/2-ethylhexyl acrylate = 19/58/23 (weight) copolymer, 46% solid MEK solution<br>Weight-average molecular weight: 70,000, acid equivalent: 450 |
| (A4) | Methacrylic acid/styrene/methyl methacrylate = 21/40/39 (weight) copolymer, 40% solid MEK solution<br>Weight-average molecular weight: 50,000, acid equivalent: 410 |
| (A5) | Methacrylic acid/benzyl methacrylate/methyl methacrylate/lauryl acrylate = 19/50/8/23 (weight) copolymer, 45% solid MEK solution<br>Weight-average molecular weight: 40,000, acid equivalent: 450 |
| (A6) | Methacrylic acid/n-butyl acrylate/methyl methacrylate = 23/10/67 (weight) copolymer, 32% solid MEK solution<br>Weight-average molecular weight: 160,000, acid equivalent: 373 |
| (A7) | Methacrylic acid/cyclohexyl methacrylate/glycidyl methacrylate addition product = 20/50/34 (weight) copolymer, 45% solid PGME/PGMEA solution<br>Weight-average molecular weight: 21,000, acid equivalent: 450 |
| (A8) | Methacrylic acid/n-butyl acrylate/methyl methacrylate = 25/10/65 (weight) copolymer, 39% solid MEK solution<br>Weight-average molecular weight: 85,000, acid equivalent: 344 |
| (A9) | Fluorene-containing epoxy acrylate compound (DENACOL FCA-293, product name of Nagase & Co., Ltd.) |
| (B1) | Trimethylolpropane trimethacrylate (SR-350FF, product name of Arkema) |
| (B2) | Ditrimethylolpropane triacrylate (AD-TMP, product name of Shin-Nakamura Chemical Co., Ltd.) |
| (B3) | Ditrimethylolpropane triacrylate (D-TMP, product name of Shin-Nakamura Chemical Co., Ltd.) |
| (B4) | Dipentaerythritol hexaacrylate (M-600, product name of Miwon Co.) |
| (B5) | Nonabutyleneglycol diacrylate (A-PTMG-65, product name of Shin-Nakamura Chemical Co., Ltd.) |
| (B6) | Polytetramethyleneglycol dimethacrylate (FA-PTG9M), product name of Hitachi Chemical Co., Ltd., $C_4H_8O$ units: 9) |

TABLE 4-continued

| Symbols | Description |
|---|---|
| (B7) | Polytetramethyleneglycol dimethacrylate (FA-PTG28M), product name of Hitachi Chemical Co., Ltd., $C_4H_8O$ units: 28) |
| (B8) | 1,6-Hexanediolacrylic acid multimer ester (VISCOAT #230D, product name of Osaka Organic Chemical Industry, Ltd.) |
| (B9) | Ethylene oxide-modified bisphenol A dimethacrylate (SR-348, product name of Arkema) |
| (B10) | Ethylene oxide-modified bisphenol A dimethacrylate (PDBE-200A, product name of NOF Corp.) |
| (B11) | 1H, 1H, 2H, 2H,-Tridecafluorooctyl acrylate (VISCOAT #13F, product name of Osaka Organic Chemical Industry, Ltd.) |
| (B12) | Polyethyleneglycol diacrylate (BLEMMER ADE-400, product name of NOF Corp.) |
| (B13) | Fluorene acrylate compound (OGSOL EA-0200, product name of Osaka Gas Chemicals Co., Ltd.) |
| (B14) | Tricyclodecanedimethanol dimethacrylate (NK Ester DCP, product name of Shin-Nakamura Chemical Co., Ltd.) |
| (B15) | Methacrylate compound with total of 9 mol ethylene oxide added to pentaerythritol |
| (B16) | E-Caprolactone-modified tris(acryloxyethyl)isocyanurate (M-327, product name of Toagosei Co., Ltd.) |
| (B17) | Heptapropyleneglycol dimethacrylate (PDP-400N, product name of NOF Corp.) |
| (B18) | Polyethyleneglycol dimethacrylate (FA-280M, product name of Hitachi Chemical Co., Ltd.) |
| (C1) | 1-[4-(Phenylthio)-2-(O-benzoyloxime)] (TR-PBG-305, product name of Nikko Chem Tech Corp.) |
| (C2) | 1,2-Propanedione-3-cyclohexyl-1-[9-ethyl-6-)2-furanylcarbonyl)-9H-carbazol-3-yl]-2-(O-acetyloxime) (TR-PBG-326, product name of Nikko Chem Tech Corp.) |
| (C3) | Ethanone-1-[9-ethyl-6-(2-methylbenzoyl)-9H-carbazol-3-yl)-1-(O-acetyloxime) (Irgacure Oxe02, product name of BASF Japan) |
| (D1) | BMI-5100 (product name of Daiwa Fine Chemicals Co., Ltd.) |
| (D2) | BMI-4000 (product name of Daiwa Fine Chemicals Co., Ltd.) |
| (D3) | MX270 (product name of Sanwa Chemicals Co., Ltd.) |
| (D4) | 4,4'-bis (Methoxymethyl)bisphenyl |
| (D5) | OXT-221 (product name of Toagosei Co., Ltd.) |
| (D6) | 4,4'-bis[(3-Ethy-3-oxetanyl)methyl]bisphenyl (OXBP, product name of Ube Industries, Ltd.) |
| (D7) | Hydrogenated bisphenol A diglycidyl ether (EPOLITE 4000, product name of Kyoeisha Chemical Co., Ltd.) |
| (E1) | 5-Caboxybenzotriazole |
| (E2) | 1-Hydroxybenzotriazole monohydrate |
| (E3) | 1-(2-di-n-Butylaminomethyl)-5-carboxybenzotriazole, 1-(2-di-n-butylaminomethyl)-6-carboxybenzotriazole 1:1 mixture |
| (E4) | 5-Amino-1H-tetrazole |
| (F1) | Aluminum salt with addition of 3 mol of nitrosophenylhydroxyamine |

As seen from the results shown in Tables 2 and 3, Examples 1 to 29 satisfied the parameters specified according to the present invention, representing excellent flex resistance, pencil hardness and rust resistance. The comparative examples, on the other hand, failed to satisfy at least one of the parameters, and were therefore unsatisfactory in terms of flex resistance, pencil hardness or rust resistance.

EXPLANATION OF SYMBOLS

1 Sample
2 Cylindrical mandrel with different selected φ

What is claimed is:
1. A photosensitive resin laminate comprising a support film, and a photosensitive resin layer including:
(A) an alkali-soluble polymer;
(B) a compound having an ethylenic unsaturated double bond; and
(C) a photopolymerization initiator;
wherein the photosensitive resin layer is laminated on the support film,
the photosensitive resin laminate is to be used to form a protective film for a conductor component,
the thickness of the photosensitive resin layer is less than or equal to 20 μm, and
a cured product of the photosensitive resin layer satisfies the following conditions (1) to (3):
(1) a crosslink density of 1,000 mol/m³ to 8,000 mol/m³;
(2) a Tan δ peak top value of 0.4 or greater; and
(3) a refractive index of 1.50 to 1.60 at a wavelength of 532 nm.

2. The photosensitive resin laminate according to claim 1, wherein the alkali-soluble polymer (A) includes an optionally substituted phenyl group.

3. The photosensitive resin laminate according to claim 1, wherein the glass transition temperature of the photosensitive resin layer after exposure is lower than 100° C.

4. The photosensitive resin laminate according to claim 1, wherein the compound having an ethylenic unsaturated double bond (B) includes a compound having at least three ethylenic unsaturated double bonds, and a compound including in the molecule a group represented by the following formula (1):

[Chemical Formula 1]

{wherein A is an alkylene group with 4 or more carbon atoms, and m is an integer of 1 to 30}.

5. The photosensitive resin laminate according to claim 1, wherein the conductor component is a copper electrode or a transparent electrode.

6. The photosensitive resin laminate according to claim 1, wherein the photosensitive resin laminate is to be used as a protective film for a touch panel or a protective film for a touch sensor.

7. The photosensitive resin laminate according to claim 1, wherein the photosensitive resin layer further includes a thermal crosslinking agent (D).

8. A pattern production method including a step of laminating the photosensitive resin laminate according to claim 1 on a substrate, and exposing and developing the laminate to form a pattern.

9. A cured film pattern obtained by subjecting a pattern formed by the method according to claim 8, to post-exposure treatment and/or heat treatment.

10. A touch panel display having the cured film pattern according to claim 9.

11. A device having the cured film pattern according to claim 9 and a touch sensor.

* * * * *